United States Patent
Kato

(10) Patent No.: US 7,563,665 B2
(45) Date of Patent: Jul. 21, 2009

(54) SEMICONDUCTOR DEVICE AND METHOD FOR MANUFACTURING SEMICONDUCTOR DEVICE

(75) Inventor: Juri Kato, Chino (JP)

(73) Assignee: Seiko Epson Corporation, Tokyo (JP)

( * ) Notice: Subject to any disclaimer, the term of this patent is extended or adjusted under 35 U.S.C. 154(b) by 434 days.

(21) Appl. No.: 11/129,511

(22) Filed: May 13, 2005

(65) Prior Publication Data

US 2005/0269645 A1 Dec. 8, 2005

(30) Foreign Application Priority Data

May 14, 2004 (JP) ............... 2004-145386
Oct. 20, 2004 (JP) ............... 2004-305535

(51) Int. Cl.
H01L 21/8238 (2006.01)
H01L 21/336 (2006.01)

(52) U.S. Cl. ............... 438/212; 438/231; 438/272; 438/283

(58) Field of Classification Search ............... 438/156, 438/157, 199, 212, 272, 283
See application file for complete search history.

(56) References Cited

U.S. PATENT DOCUMENTS

| | | | | |
|---|---|---|---|---|
| 4,503,600 A | * | 3/1985 | Nii et al. | 438/17 |
| 4,685,196 A | * | 8/1987 | Lee | 438/282 |
| 5,385,853 A | * | 1/1995 | Mohammad | 438/270 |
| 6,531,328 B1 | * | 3/2003 | Chen | 438/26 |
| 6,583,469 B1 | * | 6/2003 | Fried et al. | 257/329 |
| 6,920,267 B2 | * | 7/2005 | Abe et al. | 385/52 |
| 6,921,700 B2 | * | 7/2005 | Orlowski et al. | 438/283 |
| 2004/0063286 A1 | * | 4/2004 | Kim et al. | 438/283 |
| 2004/0245579 A1 | | 12/2004 | Ohmi | |

FOREIGN PATENT DOCUMENTS

| | | |
|---|---|---|
| EP | 0553774 A1 | 8/1993 |
| JP | 5-206422 | 8/1993 |
| JP | 10-261799 | 9/1998 |
| WO | WO-03/054962 A1 | 7/2003 |

OTHER PUBLICATIONS

Examination results issued in corresponding Korean Application on Aug. 22, 2006.

* cited by examiner

*Primary Examiner*—Walter L. Lindsay, Jr.
*Assistant Examiner*—Ron E Pompey
(74) *Attorney, Agent, or Firm*—Edwards Angell Palmer & Dodge LLP; John J. Penny, Jr.

(57) ABSTRACT

To laminate field effect transistors having different conductivity types, while suppressing deterioration of the crystallinity of semiconductor layers where the field effect transistors are formed. A single crystal semiconductor layer, a dielectric layer and a single crystal semiconductor layer are successively laminated on a dielectric layer, a gate electrode is formed on side walls on both sides of the single crystal semiconductor layers through gate dielectric films and formed on side surfaces on both side of the single crystal semiconductor layers, source/drain layers disposed respectively on both sides of the gate electrode are formed in the single crystal semiconductor layer 13*a*, and source/drain layers disposed respectively on both sides of the gate electrode are formed in the single crystal semiconductor layer, whereby a P-channel field effect transistor MP1 and an N-channel field effect transistor MN1 are laminated.

6 Claims, 22 Drawing Sheets

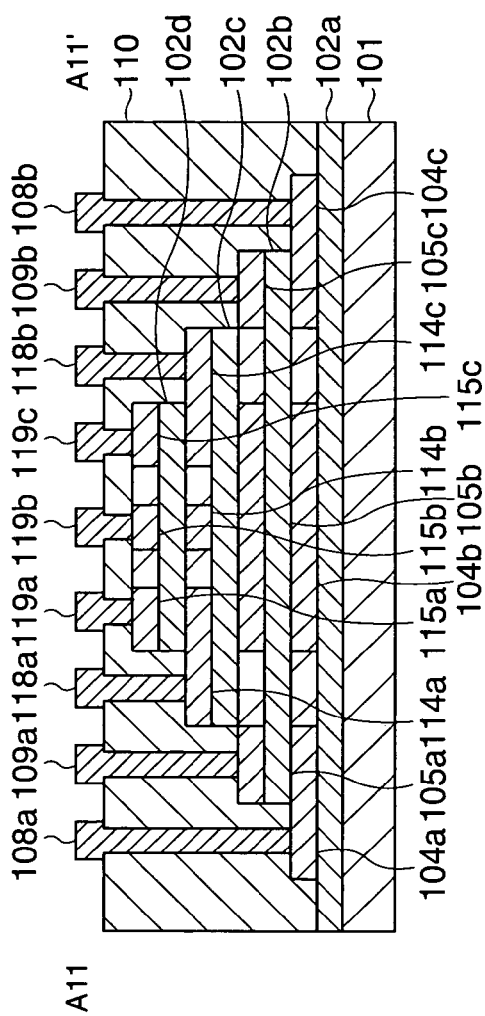
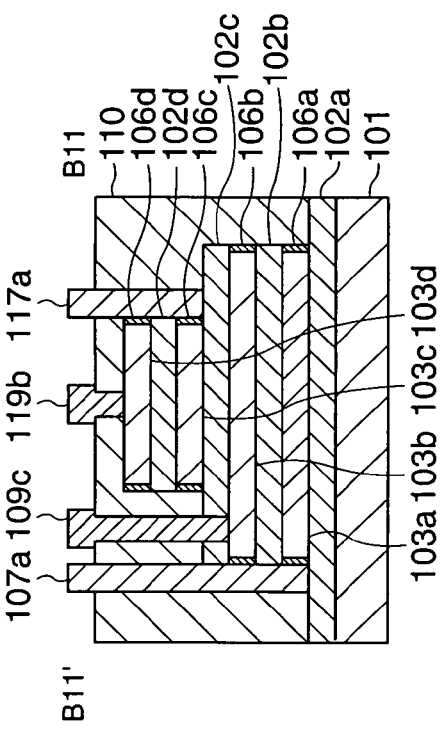
FIG.19A
FIG.19B

SEMICONDUCTOR DEVICE AND METHOD FOR MANUFACTURING SEMICONDUCTOR DEVICE

BACKGROUND

1. Technical Field

The present invention relates to semiconductor devices and methods for manufacturing semiconductor devices, and is particularly suitable to be applied to the laminated structure of field effect transistors of different conductivity types.

2. Description of Related Art

In a conventional CMOS (Complementary Metal Oxide Semiconductor) circuit, a P-channel field effect transistor and an N-channel field effect transistor are laid out adjacent to each other in the same two-dimensional plane.

Also, for example, Patent Japanese Laid-open Patent Application HEI 10-261799 (JP '799) describes a method in which, for forming a silicon thin film excellent in crystallinity and uniformity on a dielectric film of a large area, an amorphous or polycrystal silicon layer formed on a dielectric film is irradiated with a pulse-like ultraviolet beam, thereby forming a polycrystal silicon film composed of single crystal grains each in a generally square shape arranged in a chessboard pattern on the dielectric film, and the surface of the polycrystal silicon film is planarized by CMP (chemical mechanical polishing).

However, when a P-channel field effect transistor and an N-channel field effect transistor are disposed on the same two-dimensional plane, an area required for forming a CMOS circuit increases, which becomes a problem that obstructs higher density integration. Also, the wiring length necessary for connecting the P-channel field effect transistor and the N-channel field effect transistor becomes greater, which becomes a problem that increases propagation delay.

Also, when field effect transistors formed in silicon thin films are to be laminated, a field effect transistor exists in a lower layer. As a result, the flatness of a base dielectric film where a silicon thin film in an upper layer is formed deteriorates, and heat treatment conditions at the time of forming the silicon thin film in the upper layer are restricted, which causes a problem in that the crystallinity of the silicon thin film in the upper layer becomes inferior compared to the crystallinity of the silicon thin film in the lower layer.

Therefore, it is an object of at least one embodiment of the present invention to provide semiconductor devices and methods for manufacturing semiconductor devices, which can suppress deterioration of the crystallinity of semiconductor layers where field effect transistors are formed, and allow lamination of field effect transistors of different conductivity types.

SUMMARY

To solve the problems described above, a semiconductor device in accordance with an embodiment of the present invention comprises: first and second semiconductor layers laminated through a dielectric layer; a P-channel field effect transistor formed in the first semiconductor layer; and an N-channel field effect transistor formed in the second semiconductor layer.

Accordingly, while the P-channel field effect transistor and the N-channel field effect transistor can be disposed three-dimensionally, a CMOS inverter, a NAND circuit or a NOR circuit can be composed, an enlargement in the chip size can be suppressed, and devices having various elements can be composed.

Also, the semiconductor device in accordance with an embodiment of the present invention comprises: a gate electrode disposed on side walls of the first and second semiconductor layers and formed commonly for the P-channel field effect transistor and the N-channel field effect transistor; first source/drain layers disposed in the first semiconductor layer on both sides of the gate electrode; and second source/drain layers disposed in the second semiconductor layer on both sides of the gate electrode.

Accordingly, a channel region can be formed on the side surface side of the semiconductor layers, such that the field effect transistors can be composed without disposing the gate electrode on the surface of the semiconductor layer. For this reason, even when the field effect transistors are formed in the semiconductor layers, the P-channel field effect transistor and the N-channel field effect transistor can be laminated, while securing the flatness of the surface side of the semiconductor layers, and deterioration of the crystallinity of the semiconductor layers can be suppressed. As a result, the P-channel field effect transistor and the N-channel field effect transistor can be operated at high speeds with low voltages, and a higher integration of the P-channel field effect transistor and the N-channel field effect transistor can be achieved.

Also, in the semiconductor device in accordance with an embodiment of the present invention, at least one of the P-channel field effect transistor and the N-channel field effect transistor is a completely depleted field effect transistor.

Also, a semiconductor device in accordance with an embodiment of the present invention comprises an output terminal connected to the first and second semiconductor layers, a first potential input terminal connected to the first semiconductor layer, and a second potential input terminal connected to the second semiconductor layer.

Accordingly, even when the P-channel field effect transistor and the N-channel field effect transistor are laminated, the P-channel field effect transistor and the N-channel field effect transistor can be connected to each other. For this reason, a CMOS inverter can be composed while the chip size can be reduced, and higher density, higher operation speed and lower cost of CMOS inverters can be achieved.

Also, in the semiconductor device in accordance with an embodiment of the present invention, the P-channel field effect transistor and the N-channel field effect transistor comprise inverters, NAND circuits or NOR circuits, wherein the inverters, NAND circuits or NOR circuits are laminated in a plurality of layers.

Accordingly, CMOS inverters, NAND circuits or NOR circuits can be disposed three-dimensionally, and devices having various functions can be composed, while an enlargement in the chip size can be suppressed.

Also, in the semiconductor device in accordance with an embodiment of the present invention, the first semiconductor layer and the second semiconductor layer have mutually different film thicknesses.

Accordingly, the gate width of the P-channel field effect transistor can be made wider than the gate width of the N-channel field effect transistor without expanding the layout area of the P-channel field effect transistor compared to the layout area of the N-channel field effect transistor. For this reason, even when the P-channel field effect transistor and the N-channel field effect transistor have different mobility, the current drivability of the P-channel field effect transistor can be matched to that of the N-channel field effect transistor while maintaining the balance in the layout placement between the N-channel field effect transistor and the P-channel field effect transistor. As a result, the layout design of CMOS circuits can be effectively conducted, restrictions on the signal propagation speed can be alleviated, integration of semiconductor devices in higher density can be achieved, and higher speed of semiconductor devices can be achieved.

Also, in the semiconductor device in accordance with an embodiment of the present invention, a film thickness ratio between the first semiconductor layer and the second semiconductor layer is an inverse ratio of a mobility ratio between holes and electrons.

For this reason, even when the P-channel field effect transistor and the N-channel field effect transistor have different mobility, the current drivability of the P-channel field effect transistor can be matched to that of the N-channel field effect transistor without expanding the layout area of the P-channel field effect transistor compared to the layout area of the N-channel field effect transistor.

Also, in the semiconductor device in accordance with an embodiment of the present invention, the side walls of the first and second semiconductor layer are {100} planes, and the film thickness of the first semiconductor layer is in a range of two to three times the film thickness of the second semiconductor layer.

Accordingly, the current drivability of the P-channel field effect transistor can be matched to that of the N-channel field effect transistor without expanding the layout area of the P-channel field effect transistor compared to the layout area of the N-channel field effect transistor. For this reason, while maintaining the balance in the layout placement between the N-channel field effect transistor and the P-channel field effect transistor, the current drivability of the N-channel field effect transistor and that of the P-channel field effect transistor can be balanced, integration of semiconductor devices in higher density can be achieved, and higher speed of semiconductor devices can be achieved.

Also, in the semiconductor device in accordance with an embodiment of the present invention, the side walls of the first and second semiconductor layer are in a {110} plane orientation.

Accordingly, the mobility of the P-channel field effect transistor and that of the N-channel field effect transistor can be generally matched, without differentiating the layout area of the N-channel field effect transistor from that of the P-channel field effect transistor. For this reason, the current drivability of the N-channel field effect transistor and that of the P-channel field effect transistor can be balanced, while balancing the parasitic capacitances of the P-channel field effect transistor and the N-channel field effect transistor, the S/N ratio of CMOS circuits can be improved, and higher speed and higher density integration of semiconductor devices can be achieved.

Also, a semiconductor device in accordance with an embodiment of the present invention comprises: first and second semiconductor layers laminated through a dielectric layer; N number of (N is an integer of 2 or greater) gate electrodes commonly formed on side walls of the first and second semiconductor layers in a manner to be orthogonal to laminated layer surfaces of the first and second semiconductor layers; first conductivity type impurity introduced layers disposed on both sides of the gate electrodes and between the gate electrodes, and formed in the first semiconductor layer; second conductivity type impurity introduced layers disposed on both sides of the gate electrodes and between the gate electrodes, and formed in the second semiconductor layer; an output terminal connected to the first conductivity type impurity introduced layer disposed on one end of the first semiconductor layer, and connected to every other one of the second conductivity type impurity introduced layers disposed in the second semiconductor layer; a first potential input terminal connected to the first conductivity type impurity introduced layer disposed on the other end of the first semiconductor layer; and a second potential input terminal connected to every other one of the second conductivity type impurity introduced layers disposed in the second semiconductor layer in a manner to be alternately disposed with respect to the output terminals.

Accordingly, while the P-channel field effect transistor and the N-channel field effect transistor can be laminated, N number of NAND circuits or N number of NOR circuits can be composed, and the gate electrode that is commonly used for the first and second semiconductor layers can be vertically disposed. For this reason, the occupied area of the gate electrode in the chip area can be reduced, the wiring length of the gate electrode can be shortened, the propagation delay can be suppressed, and the chip size can be reduced. As a result, while devices having various functions can be composed, higher density, higher performance, higher operation speed and lower cost of semiconductor integrated circuits can be achieved.

Also, in the semiconductor device in accordance with an embodiment of the present invention, the gate electrode extends to side walls on both sides of the semiconductor layer across a surface of an uppermost layer of the semiconductor layers.

Accordingly, a channel region can be formed on side walls on both sides of the semiconductor layer, and the drivability of the field effect transistors can be increased, while an enlargement in the chip size can be suppressed. Also, by reducing the width between the side walls on both sides of the semiconductor layer, a completely depleted field effect transistor interposed between the two sidewall gate electrodes can be formed. Also, by disposing the gate electrode to extend across the surface of the semiconductor layer in the uppermost layer, even when ions are injected from the surface side of the semiconductor layer, source/drain layers can be formed in the semiconductor layer by using the gate electrode as a mask, and the source/drain layers can be formed in a self-aligned manner with respect to the gate electrode disposed on the sidewalls of the semiconductor layers. For this reason, the complexity in the manufacturing process can be controlled, and field effect transistors with excellent characteristics can be manufactured with an excellent reproducibility.

In the semiconductor device in accordance with an embodiment of the present invention, the first and second semiconductor layers are single crystal semiconductor layers.

Accordingly, even when a P-channel field effect transistor and an N-channel field effect transistor are formed in the single crystal semiconductor layers, the P-channel field effect transistor and the N-channel field effect transistor can be laminated while suppressing deterioration of the crystal quality of the single crystal semiconductor layers. For this reason, while an enlargement in the chip size can be suppressed, integration of the field effect transistors can be achieved, and while the parasitic capacitance of the field effect transistors can be reduced, steep sub-threshold characteristics can be obtained, and high speed operations at low voltages can be conducted.

Also, in the semiconductor device in accordance with an embodiment of the present invention, an upper layer of the semiconductor layers is composed to expose a surface side of source/drain layers formed in a lower layer of the semiconductor layers.

Accordingly, contacts are to be made with the source/drain layers formed in the semiconductor layer in the lower layer, interference of the semiconductor layer in the upper layer can be prevented. For this reason, even when the P-channel field effect transistor and the N-channel field effect transistor are laminated, connections of the field effect transistors can be made, while the complexity in the manufacturing process can be controlled.

Also, a semiconductor device in accordance with an embodiment of the present invention is comprising: a semiconductor layer having a side surface with a {110} plane orientation; a gate electrode disposed on a side surface of the semiconductor layer; and source/drain layers formed in the semiconductor layer to be disposed on both sides of the gate electrode, respectively.

Accordingly, a channel region can be disposed in a {110} orientation plane of the semiconductor layer, and the mobility of the P-channel field effect transistor and that of the N-channel field effect transistor can be generally matched, without differentiating the layout area of the N-channel field effect transistor from that of the P-channel field effect transistor. For this reason, while balancing the layout disposition between the N-channel field effect transistor and that of the P-channel field effect transistor, the current drivability of the N-channel field effect transistor and that of the P-channel field effect transistor can be balanced, higher density integration of semiconductor devices can be achieved, and higher speed of semiconductor devices can be achieved.

Also, in the semiconductor device in accordance with an embodiment of the present invention, the semiconductor layer is a (100) single crystal semiconductor layer that is epitaxially grown.

Accordingly, while formation of SOI transistors becomes possible, the layout of CMOS transistors can be balanced, and the current drivability of the CMOS transistors can be balanced.

Also, a method for manufacturing a semiconductor device in accordance with an embodiment of the present invention comprises: forming an opening section to expose side surfaces of first and second semiconductor layers laminated through a dielectric layer; thermally oxidizing the first and second semiconductor layer through the opening section, to thereby form a gate dielectric film on side walls of the first and second semiconductor layers; forming a gate electrode that is embedded in the opening section through the gate dielectric film in a manner to extend across a surface of an uppermost layer of the semiconductor layers; conducting an ion injection of P-type impurity from the surface side of the semiconductor layer using the gate electrode as a mask, to thereby form first source/drain layers disposed respectively on both sides of the gate electrode in the first semiconductor layer; and conducting an ion injection of N-type impurity from the surface side of the semiconductor layer using the gate electrode as a mask, to thereby form second source/drain layers disposed respectively on both sides of the gate electrode in the second semiconductor layer.

Accordingly, field effect transistors can be formed without disposing the gate electrode on the surface of the semiconductor layer, and the gate electrode that is commonly used by a plurality of field effect transistors can be formed vertically, by embedding the gate electrode in the opening section. Also, even when ions are injected from the surface side of the semiconductor layer, source/drain layers can be formed in the semiconductor layer by using the gate electrode as a mask, and the source/drain layers can be formed in a self-aligned manner with respect to the gate electrode disposed on the sidewalls of the semiconductor layers. For this reason, integration of a P-channel field effect transistor and an N-channel field effect transistor with higher density can be achieved while suppressing propagation delay, the chip size can be reduced, the P-channel field effect transistor and the N-channel field effect transistor with excellent characteristics can be manufactured with an excellent reproducibility, and higher integration, higher performance, higher speeds and lower cost of semiconductor integrated circuits can be achieved.

Also, in a method for manufacturing a semiconductor device in accordance with an embodiment of the present invention, B ions are used for the ion injection of the P-type impurity, and Sb, As or P ions are used for the ion injection of the N-type impurity.

Also, a method for manufacturing a semiconductor device in accordance with an embodiment of the present invention comprises: forming a first groove so as to mutually isolate a lower layer of the semiconductor layers; forming a second groove that mutually isolate an upper layer of the semiconductor layers so as to expose a part of the lower layer of the semiconductor layers; and embedding the first groove and the second groove with a dielectric.

Accordingly, a STI (Shallow Trench Isolation) structure can be formed such that the surface side of the source/drain layers formed in the semiconductor layer in the lower layer can be exposed through the semiconductor layer in the upper layer. For this reason, even when a P-channel field effect transistor and an N-channel field effect transistor are laminated, connections of the P-channel field effect transistor and the N-channel field effect transistor can be made, and element isolation can be stably conducted, while controlling the complexity in the manufacturing process.

Also, the method for manufacturing a semiconductor device in accordance with an embodiment of the present invention comprises: exposing at least one of the surface and the side wall of the first source/drain layers formed in the first semiconductor layer; forming a first contact layer that contacts at least one of the surface and the side wall of the first source/drain layers; exposing at least one of the surface and the side wall of the second source/drain layers formed in the second semiconductor layer; and forming a second contact layer that contacts at least one of the surface and the side wall of the second source/drain layers.

Accordingly, contacts can be made at the side walls of the semiconductor layers where the source/drain layers are formed. For this reason, the area required for making contact with the source/drain layers can be reduced, such that field effect transistors can be miniaturized, and therefore size reduction and lower cost of field effect transistors can be achieved.

Further, a method for manufacturing a semiconductor device in accordance with an embodiment of the present invention comprises: depositing a dielectric film on first and second semiconductor layers laminated through a dielectric layer; forming an opening section in the dielectric film for exposing side surfaces of the first and second semiconductor layers and a portion that becomes a channel region of a surface of the semiconductor layer in the uppermost layer; thermally oxidizing the first and second semiconductor layer through the opening section, to thereby form a gate dielectric film on the side walls of the first and second semiconductor layers in the opening section and on the surface of the semiconductor layer in the uppermost layer; conducting an ion injection of P-type impurity from the surface side of the semiconductor layer through the dielectric film with the opening section formed therein, to thereby form first source/drain layers disposed respectively on both sides of the channel region in the first semiconductor layer; conducting an ion injection of N-type impurity from the surface side of the semiconductor layer through the dielectric film with the opening section formed therein, to thereby form second source/drain layers disposed respectively on both sides of the channel region in the second semiconductor layer; and forming a gate electrode that is embedded in the opening section through the gate dielectric film.

Accordingly, laminated field effect transistors can be formed in single crystal semiconductor layers, and the source/drain layers can be formed in the semiconductor layers using the dielectric film with the opening section formed therein as a mask. For this reason, the source/drain layers can be formed in a self-aligned manner with respect to the gate electrode disposed on the side walls of the semiconductor layers, three-dimensional integration of P-channel field effect transistors and N-channel field effect transistors can be achieved, and P-channel field effect transistors and N-channel field effect transistors with excellent characteristics can be manufactured with an excellent reproducibility.

Also, a method for manufacturing a semiconductor device, comprises: forming a first opening section that exposes side surfaces of first and second semiconductor layers laminated through a dielectric film; forming a second opening section that exposes a surface of the semiconductor layer in a lower layer; thermally oxidizing the first and second semiconductor layers through the first and second opening sections, to thereby form a gate dielectric film on side walls of the first and second semiconductor layers in the first opening section and on a surface of the semiconductor layer in the second opening section; removing the gate dielectric film formed on the surface of the semiconductor layer in the second opening section; forming a gate electrode embedded in the first opening section through the gate dielectric film, and a first contact layer that is embedded in the second opening section and contacts the semiconductor layer in the lower layer; conducting an ion injection of P-type impurity from the surface side of the semiconductor layer, to thereby form first source/drain layers disposed respectively on both sides of the gate electrode in the first semiconductor layer; conducting an ion injection of N-type impurity from the surface side of the semiconductor layer, to thereby form second source/drain layers disposed respectively on both sides of the gate electrode in the second semiconductor layer; and forming a second contact layer that contacts the semiconductor layer.

When ions are injected from the surface in the first semiconductor layer that is present in a deeper region, the ions penetrate the second semiconductor layer that is located in an upper layer thereof. At this time, it is important to select the type of ions and injection acceleration energy which do not amorphousize the entire second semiconductor layer, for improving the crystallinity of the second semiconductor layer. For example, by injecting boron that has a small mass number from the surface in the first semiconductor layer that is present in a deeper region, P-type source/drain can be formed in the first semiconductor layer without harming the crystallinity of the second semiconductor layer in the upper layer.

Accordingly, P-channel field effect transistors and N-channel field effect transistors can be laminated, and the gate electrode and the first contact layer that contacts the semiconductor layer in the lower layer can be formed in a batch. For this reason, the manufacturing process can be simplified, three-dimensional integration of P-channel field effect transistors and N-channel field effect transistors can be achieved, and P-channel field effect transistors and N-channel field effect transistors with excellent characteristics can be manufactured with an excellent reproducibility.

Also, a method for manufacturing a semiconductor device in accordance with an embodiment of the present invention comprises: etching a (100) single crystal semiconductor layer to expose a side surface having {110} plane orientation; and forming a transistor with a gate disposed at the side surface in the single crystal semiconductor layer.

Accordingly, a channel region can be disposed in a {1 10} orientation plane of the semiconductor layer, and the mobility of a P-channel field effect transistor can be generally matched to that of an N-channel field effect transistor without differentiating the layout area of the N-channel field effect transistor from that of the P-channel field effect transistor.

BRIEF DESCRIPTION OF THE DRAWINGS

FIG. 19 shows a cross-sectional view schematically showing a structure of the semiconductor device in accordance with the fifth embodiment of the present invention.

DETAILED DESCRIPTION OF THE INVENTION

A semiconductor device and a method for manufacturing the same in accordance with a first embodiment of the present invention are described below with reference to the accompanying drawings.

Figure 1:
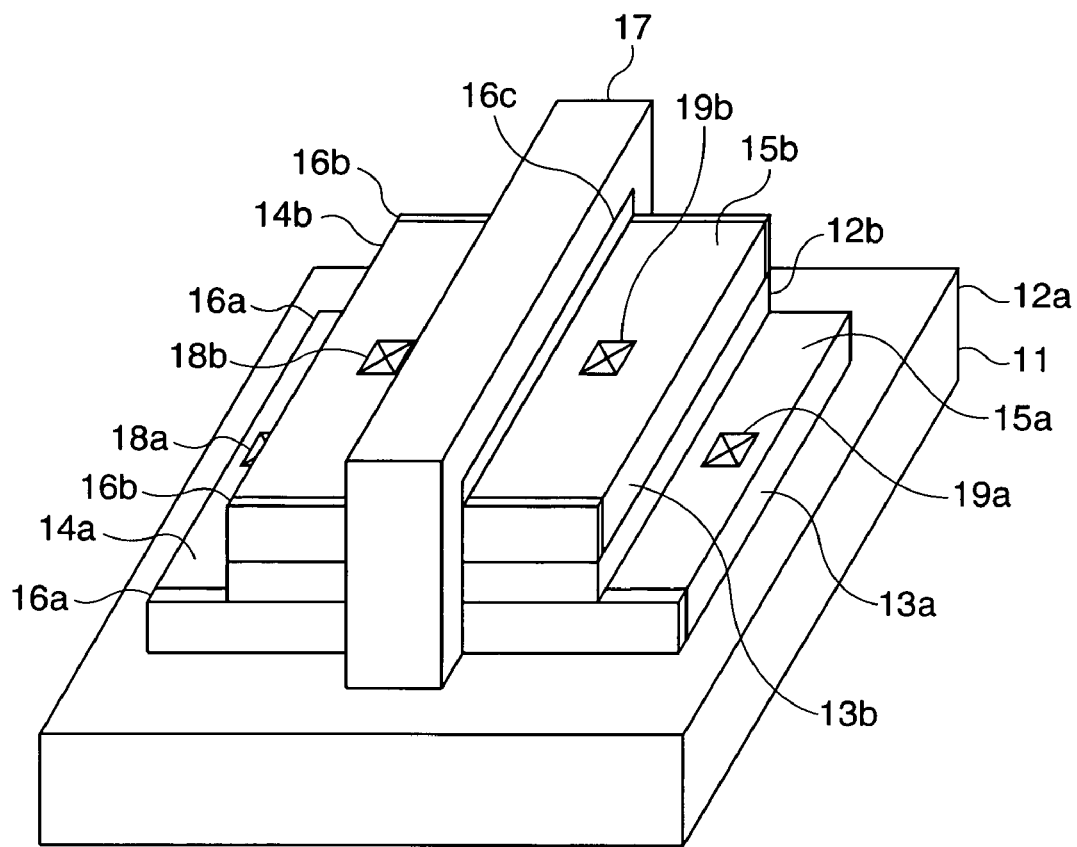
FIG. 1 shows a perspective view schematically showing a structure of a semiconductor device in accordance with a first embodiment of the present invention.
Figure 2A:
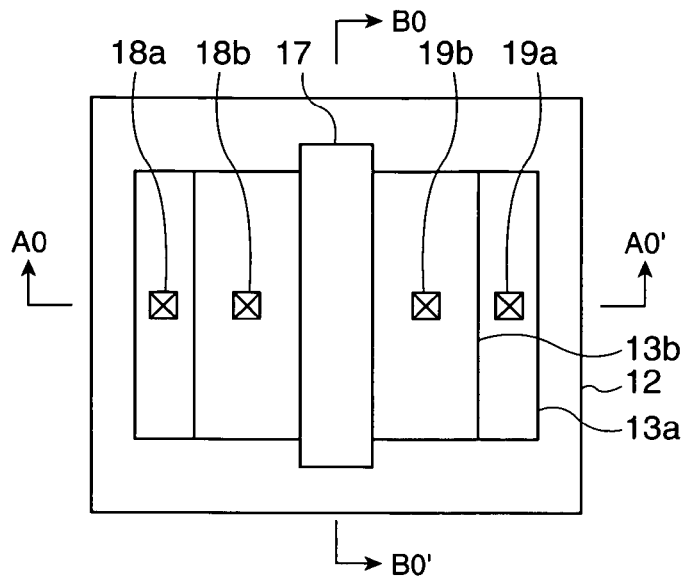
FIGS. 2(a)-2(c) show views schematically showing the structure of the semiconductor device of FIG. 1.
Figure 2B:
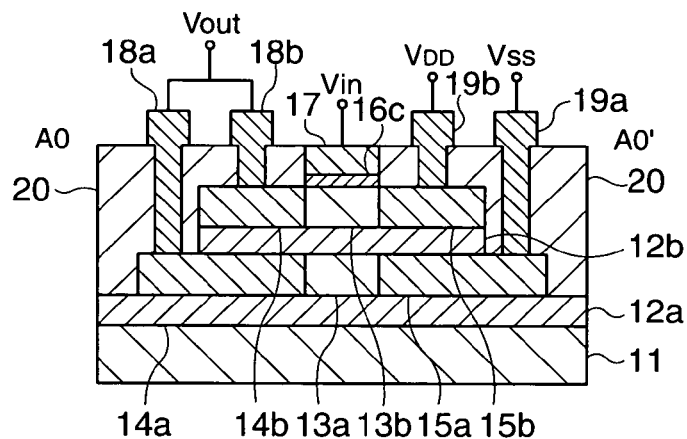
Figure 2C:
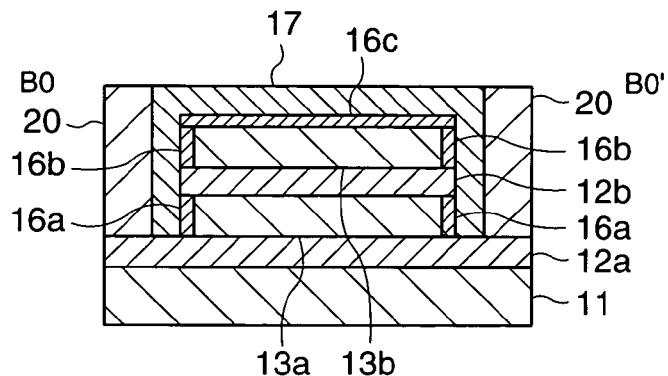
Figure 3:
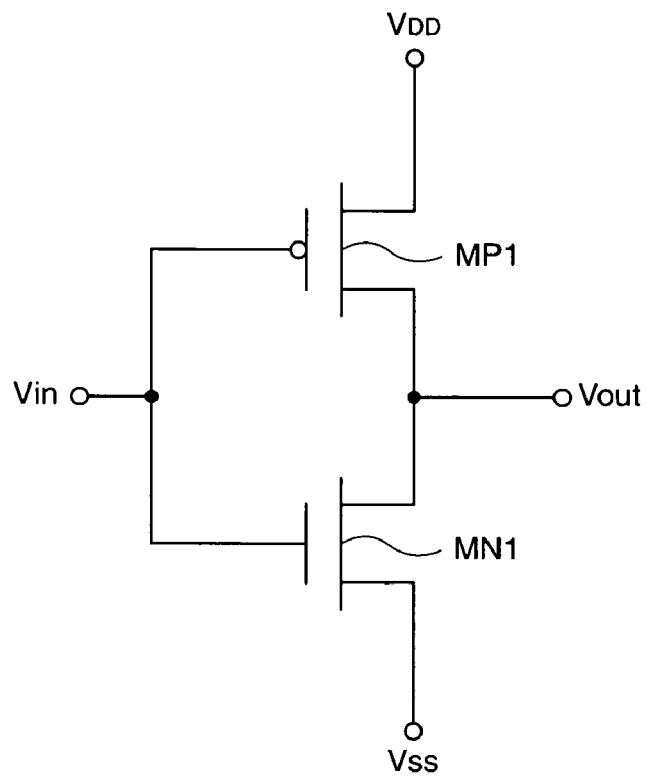
FIG. 3 shows a diagram showing a circuit structure of the semiconductor device of FIG. 1.

FIG. 1 is a perspective view schematically showing a structure of a semiconductor device in accordance with an embodiment of the present invention, FIG. 2 are views schematically showing the structure of the semiconductor device of FIG. 1, and FIG. 3 is a diagram showing a circuit structure of the semiconductor device of FIG. 1.

Referring to FIG. 1 and FIG. 2, a dielectric layer 12a is formed on a supporting substrate 11. Then, a semiconductor layer 13a, a dielectric layer 12b and a semiconductor layer 13b are successively laminated on the dielectric layer 12a. It is noted that, as the supporting substrate 11, a semiconductor substrate such as Si, Ge, SiGe, GaAs, InP, GaP, GaN, SiC, or the like may be used, or an insulating substrate such as glass, sapphire, ceramics, or the like may be used. Also, as the material of the semiconductor layers 13a and 13b, for example, Si, Ge, SiGe, SiC, SiSn, PbS, GaAs, InP, GaP, GaN, ZnSe, or the like can be used. As the dielectric layers 12a and 12b, for example, dielectric layers or embedded dielectric layers, such as, for example, $SiO_2$, SiON or $Si_3N_4$ or the like, can be used. Also, as a semiconductor substrate in which the semiconductor layer 13a, the dielectric layer 12b and the semiconductor layer 13b are successively laminated on the dielectric layer 12a, for example, a SOI substrate can be used. As the SOI substrate, a SIMOX (Separation by Implanted Oxygen) substrate, a laminated substrate, a laser annealed substrate or the like can be used. Also, as the semiconductor layers 13a and 13b, polycrystal semiconductor layers or amorphous semiconductor layers may be used, besides the single crystal semiconductor layers. It is noted that the semiconductor layer 13b may be formed to have a width narrower than that of the semiconductor layer 13a, such that surface portions of the semiconductor layer 13a near the both ends thereof are exposed through the semiconductor layer 13b.

Gate dielectric films 16a are formed on side surfaces on both sides of the semiconductor layer 13a. Also, gate dielectric films 16b are formed on side surfaces on both sides of the semiconductor layer 13b, and a gate dielectric film 16c is formed on the surface of the semiconductor layer 13b. Moreover, on the surfaces of the gate dielectric films 16a-16c, a gate electrode 17 is formed in a manner to extend across the surface of the semiconductor layer 13b to side walls on both sides of the semiconductor layers 13a and 13b, and to be disposed orthogonal to the laminated layered surfaces of the semiconductor layers 13a and 13b.

Also, source/drain layers 14a and 15a are formed respectively on both sides of the gate electrode 17 in the semiconductor layer 13a. Also, source/drain layers 14b and 15b are formed respectively on both sides of the gate electrode 17 in the semiconductor layer 13b. It is noted here that, by making the semiconductor layer 13a to be p-type, and the source/drain layers 14a and 15a to be n-type, an N-channel field effect transistor MN1 shown in FIG. 3 can be composed. Also, by making the semiconductor layer 13b to be n-type, and the source/drain layers 14b and 15b to be p-type, a P-channel field effect transistor MP1 shown in FIG. 3 can be composed.

Further, a dielectric layer 20 is deposited on the semiconductor layer 13b where the source/drain layers 14b and 15b are formed. Contact layers 18a and 19a to make contact with the source/drain layers 14a and 15a respectively are formed on the dielectric layer 20, and contact layers 18b and 19b to make contact with the source/drain layers 14b and 15b respectively are formed on the dielectric layer 20. Here, the gate electrode 17 is connected with an input terminal Vin, the drain layers 14a and 14b are connected with an output terminal Vout through the contact layers 18a and 18b, the source layer 15a is connected with a potential input terminal Vss through the contact layer 19a, and the source layer 15b is connected with a potential input terminal VDD through the contact layer 19b, whereby a CMOS inverter composed of the P-channel field effect transistor MP1 and the N-channel field effect transistor MN1 can be formed, as shown in FIG. 3.

Accordingly, while the P-channel field effect transistor MP1 and the N-channel field effect transistor MN1 can be laminated, a CMOS inverter can be formed, and higher density, higher operation speed and lower cost of the CMOS inverter can be achieved.

Also, by forming the gate electrode 17 on the side walls on both sides of the semiconductor layers 13a and 13b, channel regions can be formed on the side of the side surfaces of the semiconductor layers 13a and 13b, such that the P-channel field effect transistor MP1 and the N-channel field effect transistor MN1 can be laminated without disposing the gate electrode 17 between the semiconductor layers 13a and 13b. For this reason, even when the P-channel field effect transistor MP1 and the N-channel field effect transistor MN1 are laminated, the flatness of the surface side of the semiconductor layers 13a and 13b can be secured, deterioration of the crystallinity thereof can be suppressed, and defects in interfaces between the semiconductor layers 13a and 13b and the gate dielectric films 16a and 16b can be reduced. As a result, the P-channel field effect transistor MP1 and the N-channel field effect transistor MN1 can be operated at high speeds with low voltages, and the P-channel field effect transistor MP1 and the N-channel field effect transistor MN1 can be integrated in high density.

Also, by disposing the gate electrode 17 on the side walls of the semiconductor layers 13a and 13b in a manner to be orthogonal to the laminated layer surfaces of the semiconductor layers 13a and 13b, the gate electrode 17 that is commonly used by the semiconductor layers 13a and 13b can be disposed upright. For this reason, the area occupied by the gate electrode 17 in the chip surface can be reduced, the wiring length of the gate electrode 17 can be shortened, the propagation delay can be suppressed, and the chip size can be reduced.

It is noted that, in the embodiment described above, the description is made as to the method in which the contact layers 18a and 19a are disposed respectively on the source/drain layers 14a and 15a, and the contact layers 18b and 19b are disposed respectively on the source/drain layers 14b and 15b. However, the contact layers 18a and 19a may be disposed respectively on side walls of the source/drain layers 14a and 15a, and the contact layers 18b and 19b may be disposed on side walls of the source/drain layers 14b and 15b.

Accordingly, there is no need to make contact on the side of the surfaces of the source/drain layers 14a and 15a and the source/drain layers 14b and 15b, such that the area on the side of the surfaces of the source/drain layers 14a and 15a and the source/drain layers 14b and 15b can be reduced. For this reason, the P-channel field effect transistor MP1 and the N-channel field effect transistor MN1 can be miniaturized, and size reduction and lower cost of the P-channel field effect transistor MP1 and the N-channel field effect transistor MN1 can be achieved.

Figure 4A:
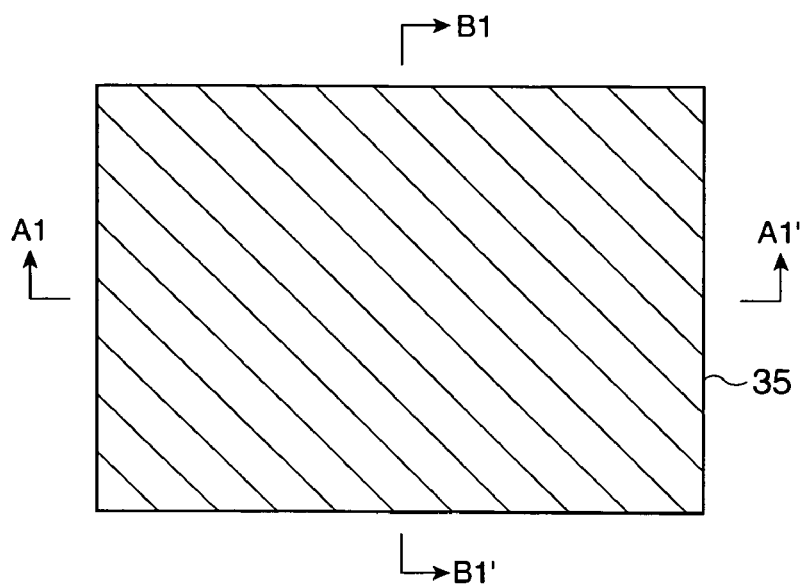
FIGS. 4(a)-4(c) show views showing a method for manufacturing a semiconductor device in accordance with a second embodiment of the present invention.
Figure 4B:
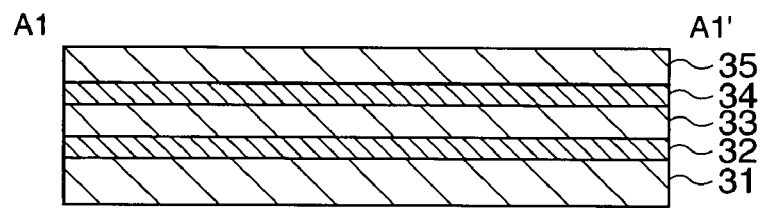
Figure 4C:
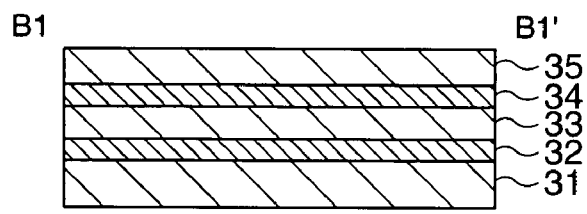
Figure 11A:
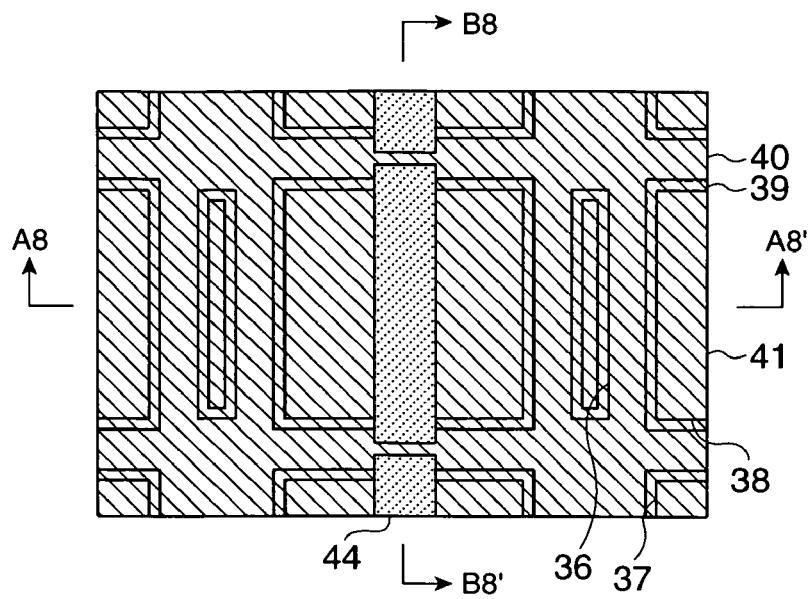
FIGS. 11(a)-11(c) show views showing the method for manufacturing a semiconductor device in accordance with the second embodiment of the present invention.
Figure 11B:
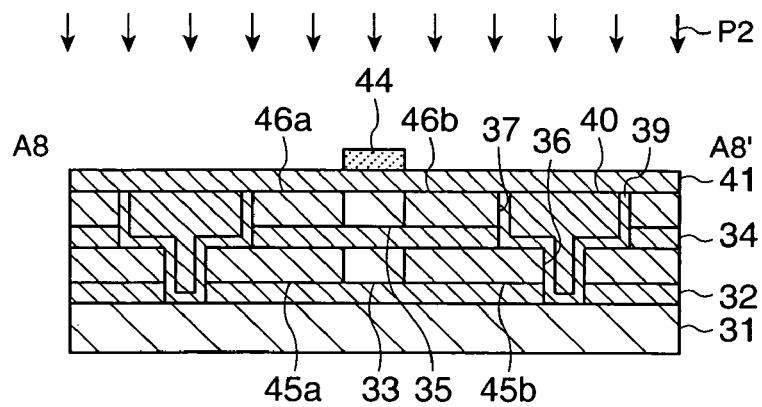
Figure 11C:
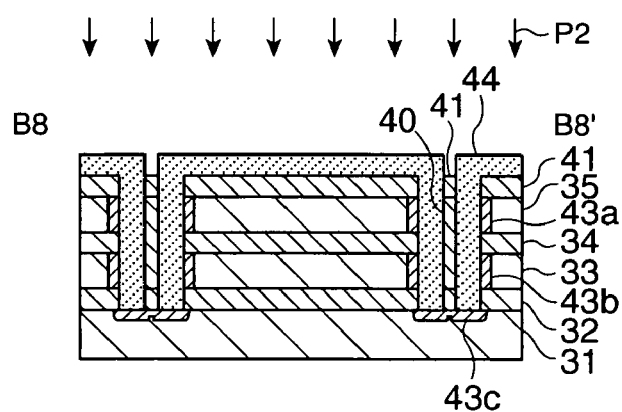
Figure 12A:
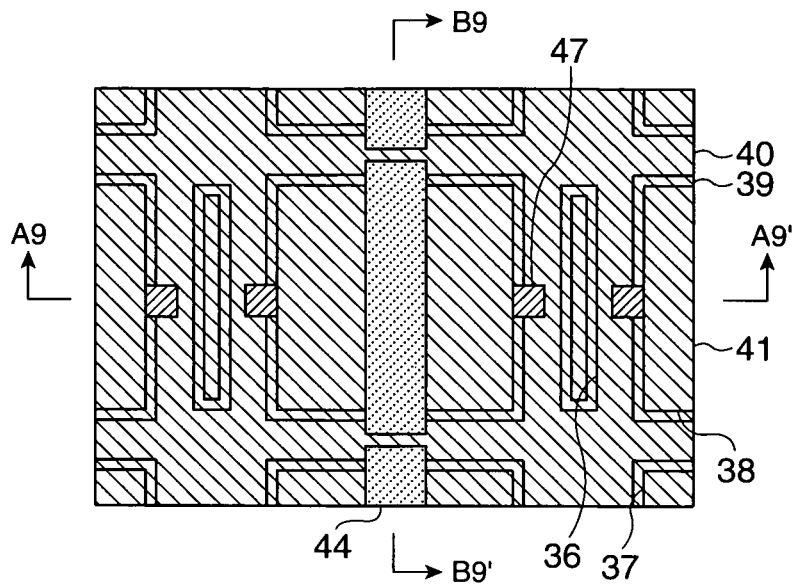
FIG. 12(a)-12(c) show views showing the method for manufacturing a semiconductor device in accordance with the second embodiment of the present invention.
Figure 12B:
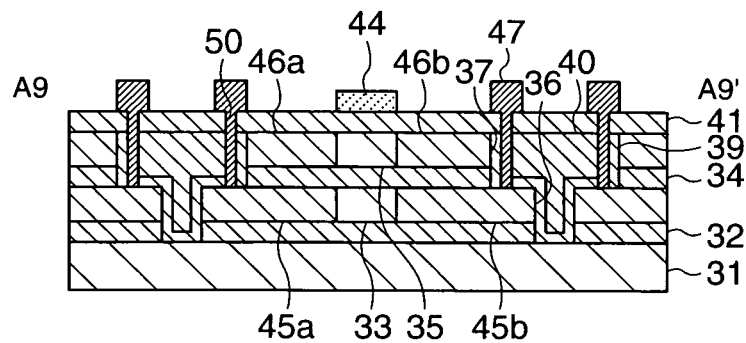
Figure 12C:
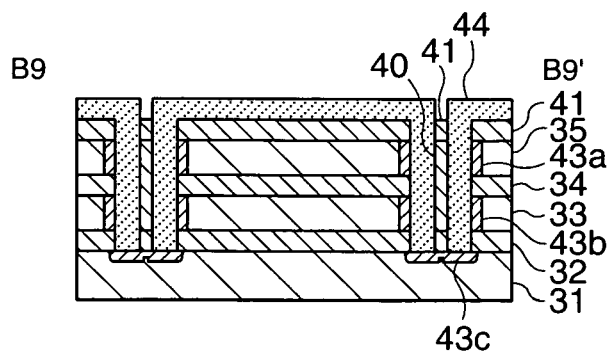
Figure 13A:
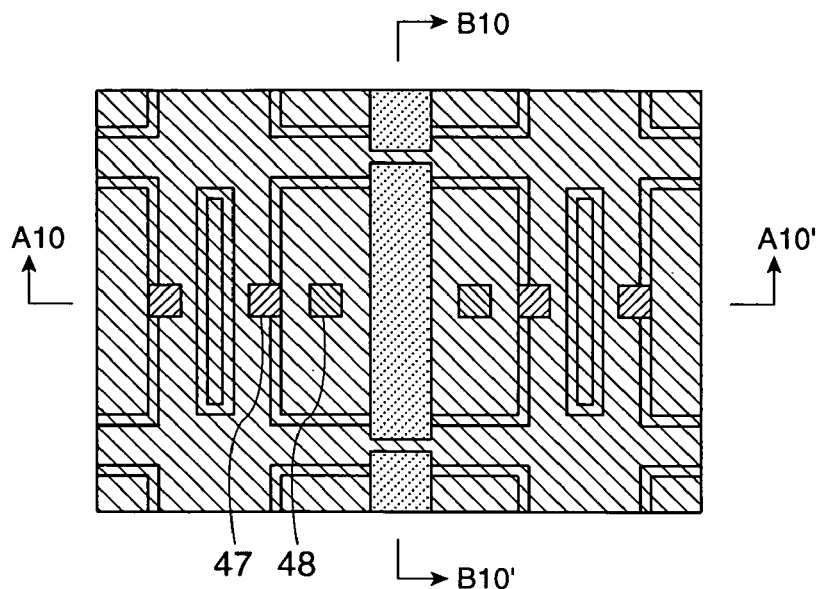
FIG. 13(a)-13(c) show views showing the method for manufacturing a semiconductor device in accordance with the second embodiment of the present invention.
Figure 13B:
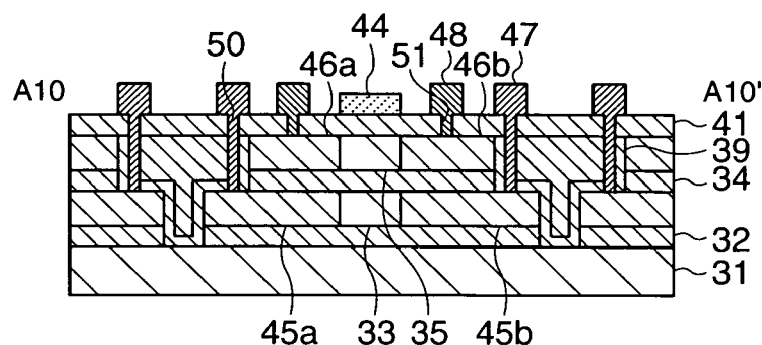
Figure 13C:
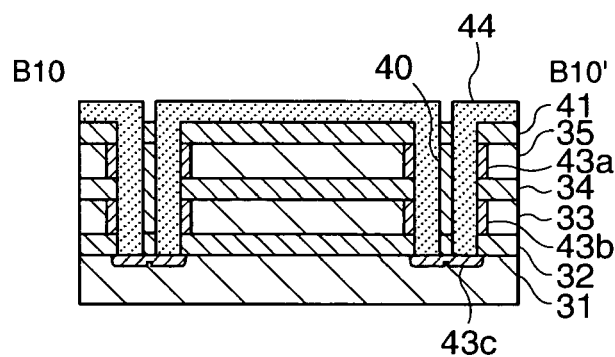

FIG. 4 (a)-FIG. 13 (a) are plan views showing a method for manufacturing a semiconductor device in accordance with a second embodiment of the present invention, FIG. 4 (b)-FIG. 13 (b) are cross-sectional views taken along lines A1-A1' through A10-A10' of FIG. 4(a)-FIG. 13 (a), respectively, and FIG. 4 (c)-FIG. 13 (c) are cross-sectional views taken along lines B1-B1' through B10-B10' of FIG. 4 (a)-FIG. 13 (a), respectively. Referring to FIG. 4, a dielectric layer 32, a single crystal semiconductor layer 33, a dielectric layer 34 and a single crystal semiconductor layer 35 are successively formed on a semiconductor substrate 31. It is noted that, as the semiconductor substrate 31 and the single crystal semiconductor layers 33 and 35, for example, Si may be used. Also, when the dielectric layer 32, the single crystal semiconductor layer 33, the dielectric layer 34 and the single crystal semiconductor layer 35 successively which are laminated on the semiconductor substrate 31 are formed, oxygen ions of high concentration with different injection energy levels may be introduced in the semiconductor substrate 31, and regions where the oxygen ions are introduced may be thermally oxidized, whereby the dielectric layers 32 and 34 can be formed on the semiconductor substrate 31.

Figure 5A:
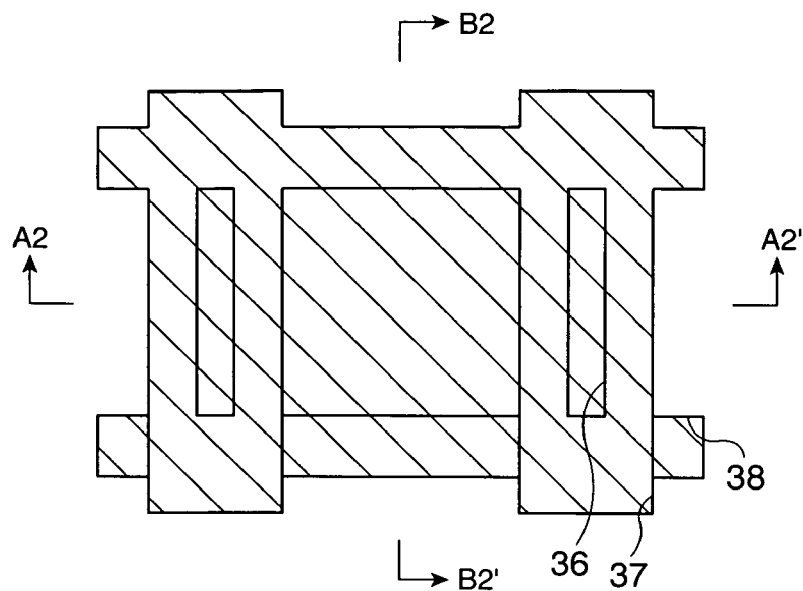
FIGS. 5(a)-5(c) show views showing the method for manufacturing a semiconductor device in accordance with the second embodiment of the present invention.
Figure 5B:
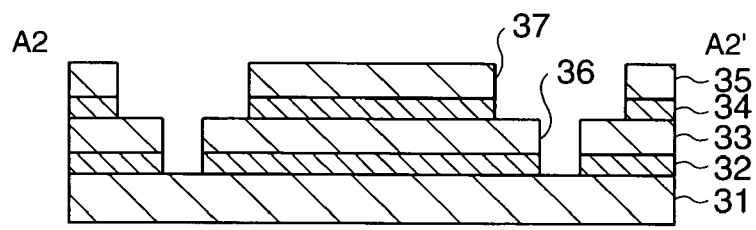
Figure 5C:
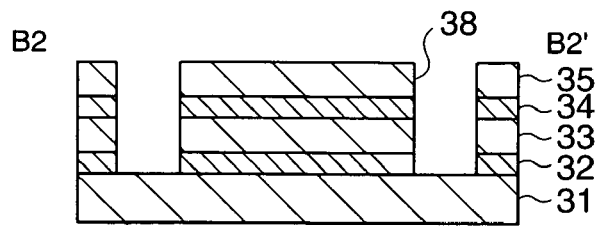

Next, as shown in FIG. 5, the single crystal semiconductor layer 35, the dielectric layer 34, the single crystal semiconductor layer 33, and the dielectric layer 32 are patterned by using a photolithography technique and an etching technique, thereby forming grooves 36 that expose the semiconductor substrate 31 along a predetermined direction, and forming grooves 38 that expose the semiconductor substrate 31 along a direction perpendicular to the grooves 36.

It is noted that, when the semiconductor substrate 31 is exposed at the time of forming the grooves 36 and 38, etching may be stopped on the surface of the semiconductor substrate 31, or recessed portions may be formed in the semiconductor substrate 31 by over-etching the semiconductor substrate 31.

Further, by using a photolithography technique and an etching technique, the single crystal semiconductor layer 35 and the dielectric layer 34 are patterned, thereby forming grooves 37 disposed over the grooves 36, each having a width greater than the groove 36, and exposing surfaces of the single crystal semiconductor layer 33 adjacent the both end sections thereof. It is noted that the disposed positions of the grooves 36 and 38 can be made to correspond to element isolation regions of the semiconductor layer 33, and the disposed positions of the grooves 37 and 38 can be made to correspond to element isolation regions of the semiconductor layer 35.

Figure 6A:
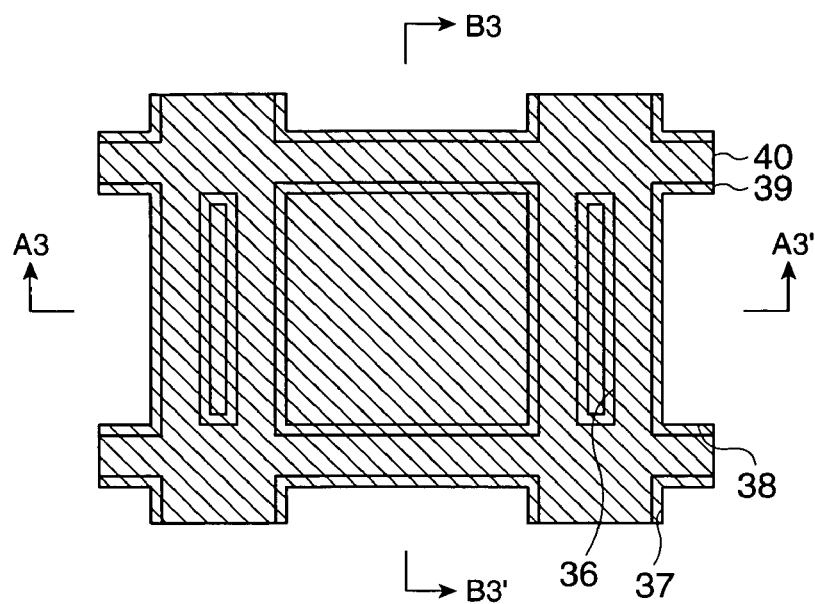
FIGS. 6(a)-6(c) show views showing the method for manufacturing a semiconductor device in accordance with the second embodiment of the present invention.
Figure 6B:
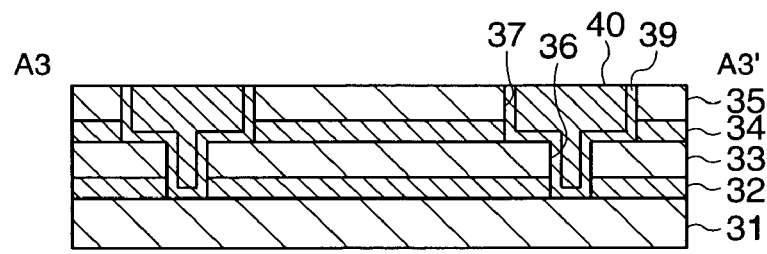
Figure 6C:
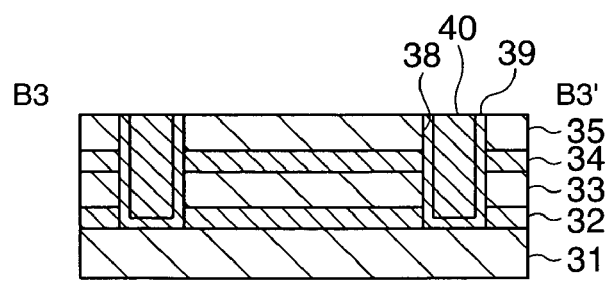

Next, as shown in FIG. 6, by thermally oxidizing the semiconductor substrate 31 and the single crystal semiconductor layers 33 and 35, oxide films 39 are formed on side walls of the single crystal semiconductor layers 33 and 35, and surfaces of the semiconductor substrate 31 in the grooves 36 and 38. Then, by using a CVD method or the like, a dielectric layer is deposited over the single crystal semiconductor layer 35 such that the grooves 36-38 where the oxide films 39 are formed are embedded. Then, the dielectric layer is planarized by using a CMP (Chemical Mechanical Polishing) method or the like, thereby exposing the surface of the single crystal semiconductor layer 35, and forming embedded dielectric layers 40 in the grooves 36-38. It is noted that, for example, $SiO_2$, $Si_3N_4$ or the like can be used as the embedded dielectric layers 40.

Figure 7A:
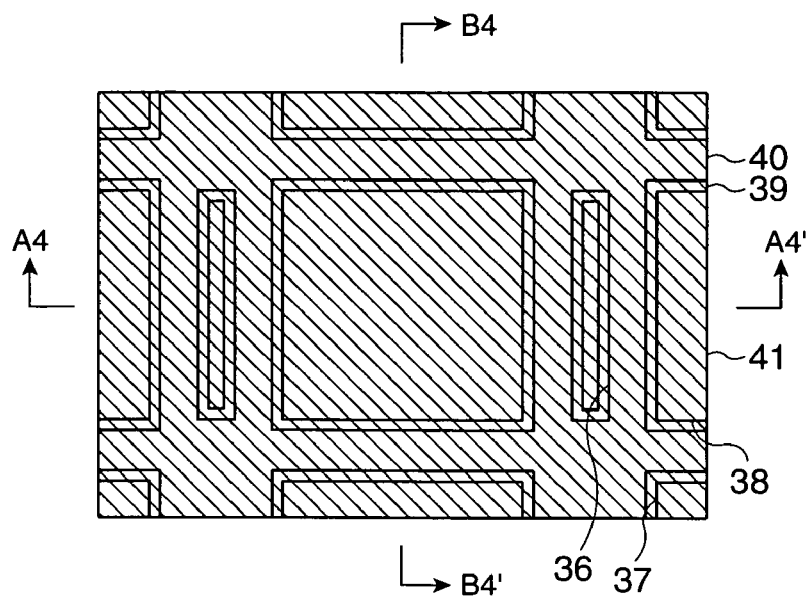
FIGS. 7(a)-7(c) show views showing the method for manufacturing a semiconductor device in accordance with the second embodiment of the present invention.
Figure 7B:
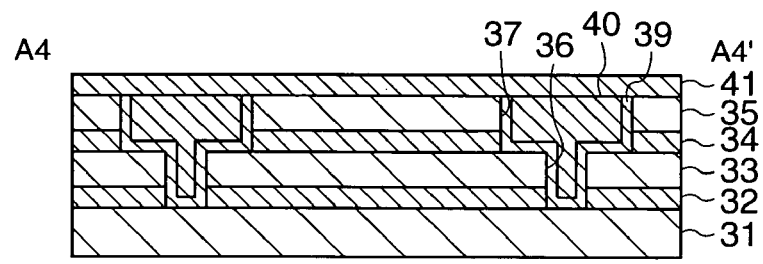
Figure 7C:
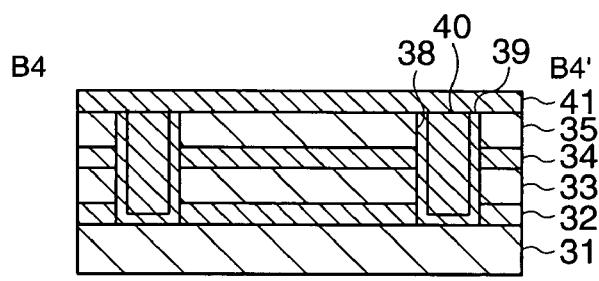

Next, as shown in FIG. 7, a dielectric layer 41 is deposited on the single crystal semiconductor layer 35 by a CVD method or the like. It is noted that, as the dielectric layer 41, for example, $SiO_2$ or the like can be used.

Figure 8A:
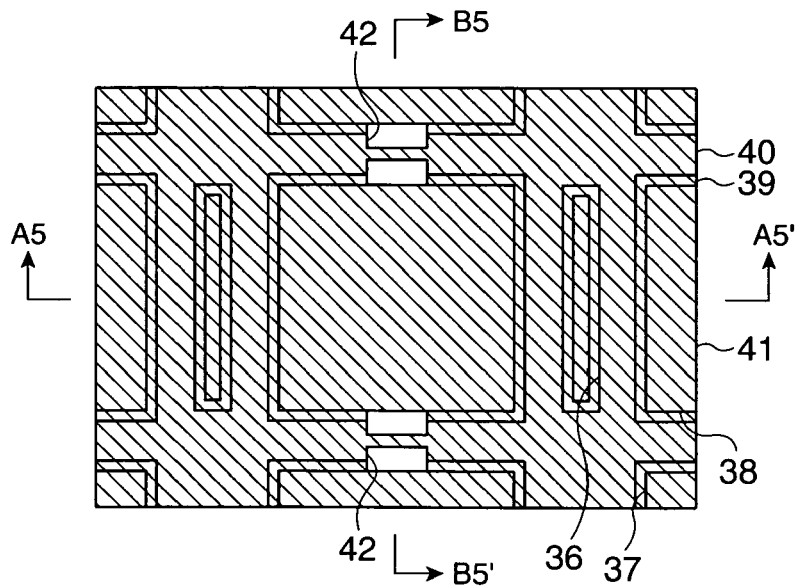
FIGS. 8(a)-8(c) show views showing the method for manufacturing a semiconductor device in accordance with the second embodiment of the present invention.
Figure 8B:
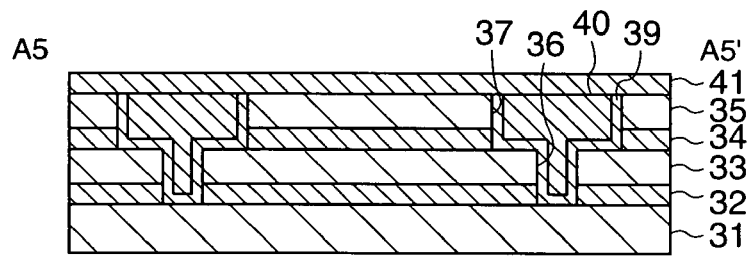
Figure 8C:
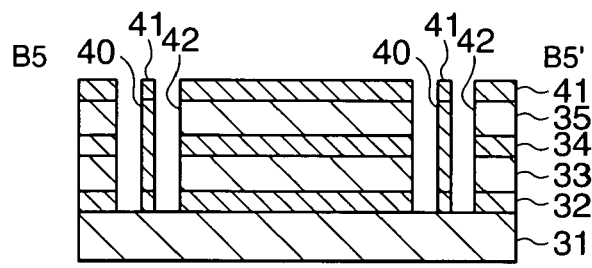

Next, as shown in FIG. 8, by using a photolithography technique and an etching technique, the dielectric layer 41, the embedded dielectric layers 40 and the oxide films 39 are patterned, thereby forming opening sections 42 that expose side surfaces of the single crystal semiconductor layers 33 and 35. It is noted that the opening sections 42 can be disposed in the element isolation regions where the grooves 38 are formed.

It is noted here that, when the opening sections 42 that expose the side surfaces of the single crystal semiconductor layers 33 and 35 are formed, etching may be stopped on the surface of the semiconductor substrate 31, or recessed portions may be formed in the semiconductor substrate 31 by over-etching the semiconductor substrate 31. It is noted that, when the opening sections 42 that expose the side surfaces of the single crystal semiconductor layers 33 and 35 are formed, the semiconductor substrate 31 does not need to be exposed, and etching may be stopped at the surface of the dielectric layer 32, or recessed portions may be formed in the dielectric layer 32 by over-etching the dielectric layer 32.

Figure 9A:
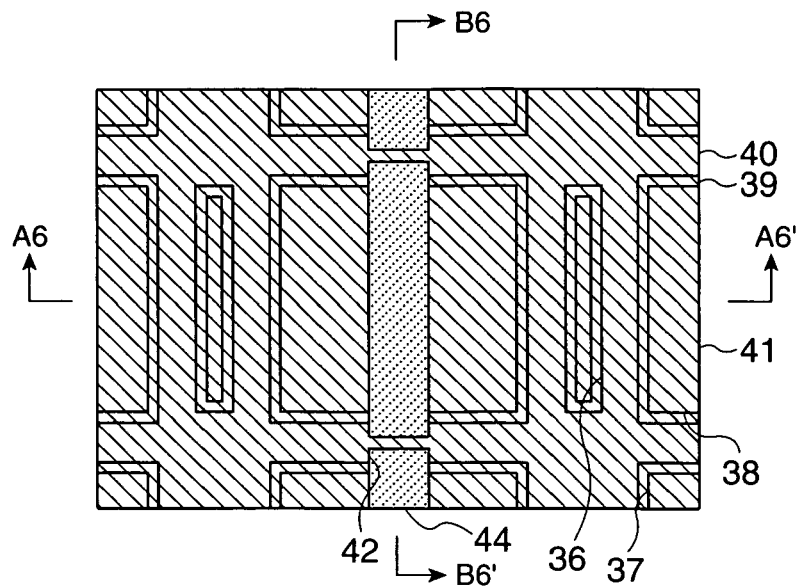
FIGS. 9(a)-9(c) show views showing the method for manufacturing a semiconductor device in accordance with the second embodiment of the present invention.
Figure 9B:
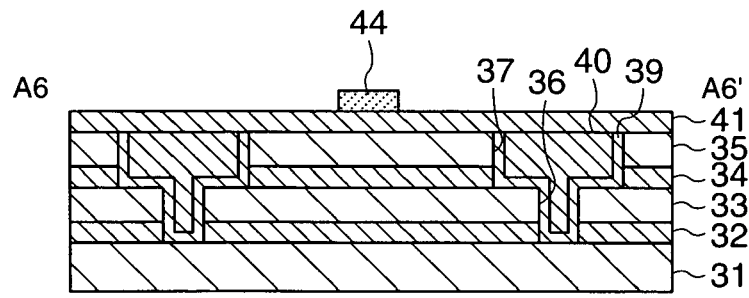
Figure 9C:
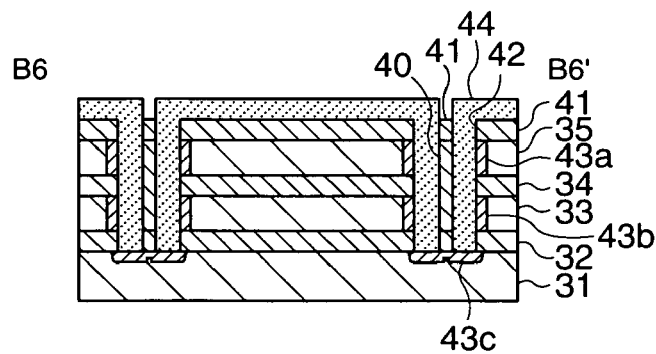

Next, as shown in FIG. 9, by thermally oxidizing the semiconductor substrate 31 and the single crystal semiconductor layers 33 and 35, gate dielectric films 43a and 43b are formed on side walls of the single crystal semiconductor layers 35 and 33, respectively, and gate dielectric films 43c are formed on surfaces of the semiconductor substrate in the opening section 42. It is noted that sacrificial oxide films may be formed once on the side surfaces of the single crystal semiconductor layers 35 and 33 by thermal oxidation, and then, after removing the sacrificial oxide films, gate dielectric films 43a and 43b may be formed on the side walls of the single crystal semiconductor layers 35 and 33.

Then, by a CVD method or the like, a conductive layer is deposited on the dielectric layer 41 in a manner to embed the opening sections 42. Then, the conductive layer is patterned by using a photolithography technique and an etching technique, thereby forming a gate electrode 44 that is embedded in the opening sections 42.

Accordingly, by embedding the gate electrode 44 in the opening sections 42, the gate electrode 44 can be disposed upright on the semiconductor substrate 31, and the gate electrode 44 can be commonly used by field effect transistors that are to be formed in the single crystal semiconductor layers 33 and 35, respectively. For this reason, the occupied area of the gate electrode 44 in the chip surface can be reduced, the wiring length of the gate electrode 44 can be shortened, the propagation delay can be suppressed, integration of field effect transistors in high density can be achieved, the chip size can be reduced, and higher operation speed, smaller size and lower cost of field effect transistors can be achieved.

It is noted that, as the material of the gate electrode 44, a metal film such as W, TiN or the like may be used, besides polycrystal silicon.

Figure 10A:
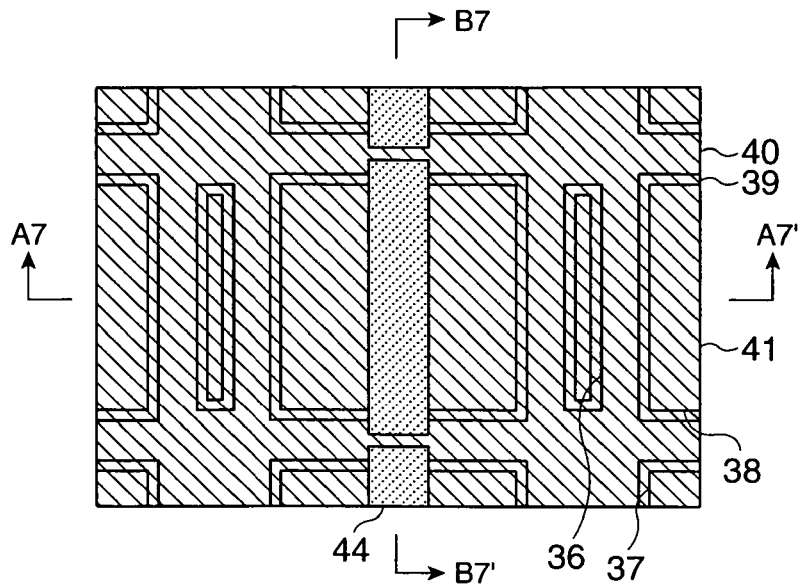
FIGS. 10(a)-10(c) show views showing the method for manufacturing a semiconductor device in accordance with the second embodiment of the present invention.
Figure 10B:
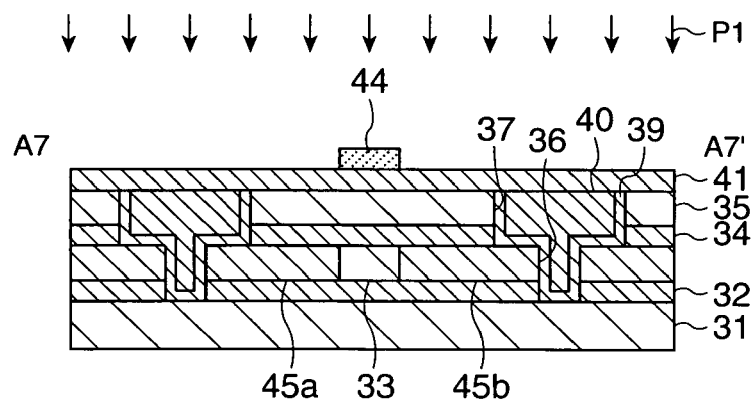
Figure 10C:
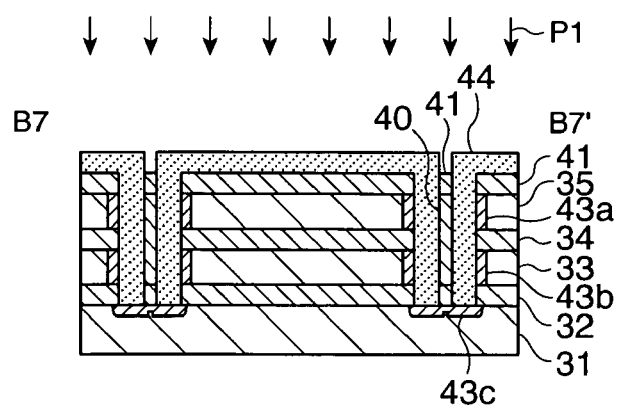

Next, as shown in FIG. 10, by selectively injecting ions P1 of N-type impurity from the surface side of the single crystal semiconductor layer 35, source/drain layers 45a and 45b disposed respectively on both sides of the gate electrode 44 are formed in the single crystal semiconductor layer 33. When the source/drain layers 45a and 45b are formed in the single crystal semiconductor layer 33, the energy for injecting ions P1 of N-type impurity may be selected so that the range distance of the impurity corresponds to the depth of the single crystal semiconductor layer 33.

Here, by disposing the gate electrode 44 in a manner to extend across the surface of the single crystal semiconductor layer 35 in the uppermost layer, the source/drain layers 45*a* and 45*b* can be formed in the single crystal semiconductor layer 33 with the gate electrode 44 acting as a mask, even when the N-type impurity ions are injected from the surface side of the single crystal semiconductor layer 35, and the source/drain layers 45*a* and 45*b* can be formed in a self-aligned manner with respect to the gate electrode 44 disposed on the side walls of the single crystal semiconductor layer 33. For this reason, the complexity in the manufacturing process can be controlled, and the N-channel field effect transistor with excellent characteristics can be formed in the single crystal semiconductor layer 33 with an excellent reproducibility.

Next, as shown in FIG. 11, by selectively injecting ions P2 of P-type impurity from the surface side of the single crystal semiconductor layer 35, source/drain layers 46*a* and 46*b* disposed respectively on both sides of the gate electrode 44 are formed in the single crystal semiconductor layer 35. When the source/drain layers 46*a* and 46*b* are formed in the single crystal semiconductor layer 35, the energy for injecting ions P2 of P-type impurity may be selected so that the range distance of the impurity corresponds to the depth of the single crystal semiconductor layer 35.

It is noted here that, by injecting Sb, As or P ions in the source/drains 46*a* and 46*b* in the single crystal semiconductor layer 35 in the uppermost layer, in its source/drain semiconductor layer surfaces, the single crystal semiconductor layer 33 in the lower layer is not damaged, and a surface amorphous layer caused by injection damage in the single crystal semiconductor layer 35 in the upper layer epitaxially grows in a solid phase by annealing that is to be conducted after the injection, and secures excellent crystallinity. Also, by injecting B ions in the source/drain 45*a* and 45*b* in the single crystal semiconductor layer 33 in the lower layer, damage to the single crystal semiconductor layer 35 in the upper layer is small because the B ions are light, and therefore the single crystal semiconductor layer in the upper layer can secure excellent crystallinity, and the crystallinity of the source/drain in the single crystal semiconductor layer 33 in the lower layer can also be recovered by annealing.

Here, by disposing the gate electrode 44 in a manner to extend across the surface of the single crystal semiconductor layer 35 in the uppermost layer, the source/drain layers 46*a* and 46*b* can be formed in the single crystal semiconductor layer 35 with the gate electrode 44 acting as a mask, even when the P-type impurity ions are injected from the surface side of the single crystal semiconductor layer 35, and the source/drain layers 46*a* and 46*b* can be formed in a self-aligned manner with respect to the gate electrode 44 disposed on the side walls of the single crystal semiconductor layer 35.

Also, by providing the gate electrode 44 on the side walls on both sides of the single crystal semiconductor layers 33 and 35, channel regions can be formed on side walls on both sides of the single crystal semiconductor layers 33 and 35. For this reason, the complexity in the manufacturing process can be controlled, the derivability of the field effect transistors can be increased, an enlargement in the chip size can be suppressed, and high speed, smaller size and lower cost of field effect transistors can be achieved.

Also, by mutually laminating the P-channel field effect transistor MP1 and the N-channel field effect transistor NP1, while the P-channel field effect transistor MP1 and the N-channel field effect transistor NP1 can be three-dimensionally disposed, CMOS inverters, NAND circuits or NOR circuits can be composed, an enlargement in the chip size can be suppressed, and devices having various functions can be composed.

Next, as shown in FIG. 12, by using a photolithography technique and an etching technique, the dielectric layer 41, the embedded dielectric layers 40 and the oxide films 39 are patterned, thereby forming opening sections 50 that expose surfaces of the source/drain layers 45*a* and 45*b*. Then, by using a CVD method or the like, a conductive layer is deposited on the dielectric layer 41 in a manner to embed the opening sections 50. Then, the conductive layer is patterned by using a photolithography technique and an etching technique, thereby forming contact layers 47 for making contact with the source/drain layers 45*a* and 45*b* on the dielectric layer 41.

Here, by making the groove 37 wider than the groove 36, areas adjacent to the both ends of the source/drain layers 45*a* and 45*b* formed in the single crystal semiconductor layer 33 in the lower layer can be exposed through the single crystal semiconductor layer 35 in the upper layer. For this reason, while the complexity in the manufacturing process can be controlled, contact can be made with the source/drain layers 45*a* and 45*b*.

Next, as shown in FIG. 13, by using a photolithography technique and an etching technique, the dielectric layer 41 is patterned, thereby forming opening sections 51 that expose surfaces of the source/drain layers 46*a* and 46*b*. Then, by using a CVD method or the like, a conductive layer is deposited on the dielectric layer 41 in a manner to embed the opening sections 51. Then, the conductive layer is patterned by using a photolithography technique and an etching technique, thereby forming contact layers 48 for making contact with the source/drain layers 46*a* and 46*b* on the dielectric layer 41.

It is noted that, in the embodiment described above, the description is made as to the method in which the source/drain layers 45*a*, 45*b*, 46*a* and 46*b* are formed by using the gate electrode 44 as a mask. However, when the source/drain layers 45*a*, 45*b*, 46*a* and 46*b* are formed, a resist pattern for forming the gate electrode 44 can be used as a mask for the ion injection.

Further, in the case of forming the source/drain layers 45*a*, 45*b*, 46*a* and 46*b* in a self-aligned manner with respect to the gate electrode 44, opening sections that expose portions that become channel regions in the surface of the single crystal semiconductor layer 35 and the side surfaces of the single crystal semiconductor layers 33 and 35 may be formed in the dielectric layer 41 before forming the gate electrode 44, and ions may be injected by using the dielectric layer 41 where the opening sections for exposing the portions to become channel regions are formed as a mask, thereby forming the source/drain layers 45*a*, 45*b*, 46*a* and 46*b*. Then, after the source/drain layers 45*a*, 45*b*, 46*a* and 46*b* are formed, the gate electrode 44 may be embedded in the opening sections formed in the dielectric layer 41, such that the source/drain layers 45*a*, 45*b*, 46*a* and 46*b* can be disposed in a self-aligned manner with respect to the gate electrode 44.

Also, in the embodiment described above, the description is made as to the method in which, after the gate electrode 44 is formed, the source/drain layers 45*a*, 45*b*, 46*a* and 46*b* are formed by using the gate electrode 44 as a mask, and then the contact layers 47 and 48 are formed. However, the gate electrode 44 and the contact layer 47 may be formed in a batch.

Figure 14:
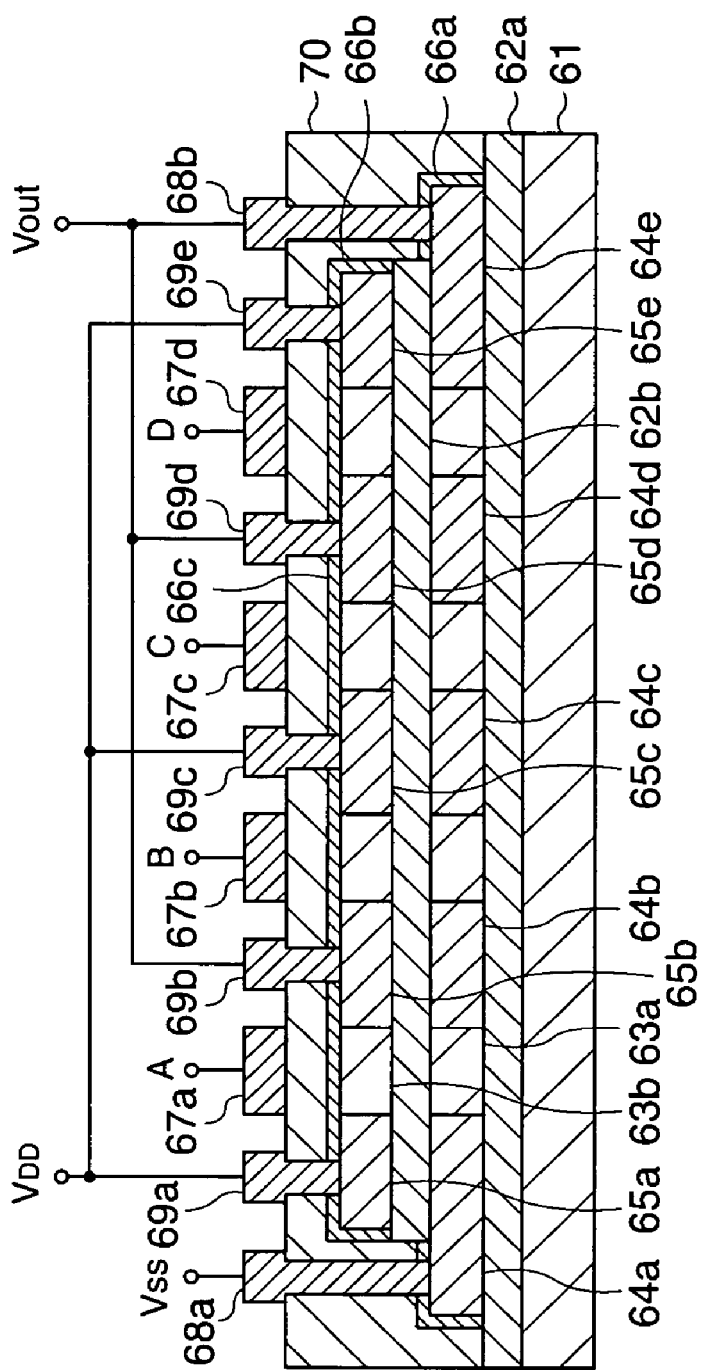
FIG. 14 shows a cross-sectional view schematically showing a structure of a semiconductor device in accordance with a third embodiment of the present invention.
Figure 15:
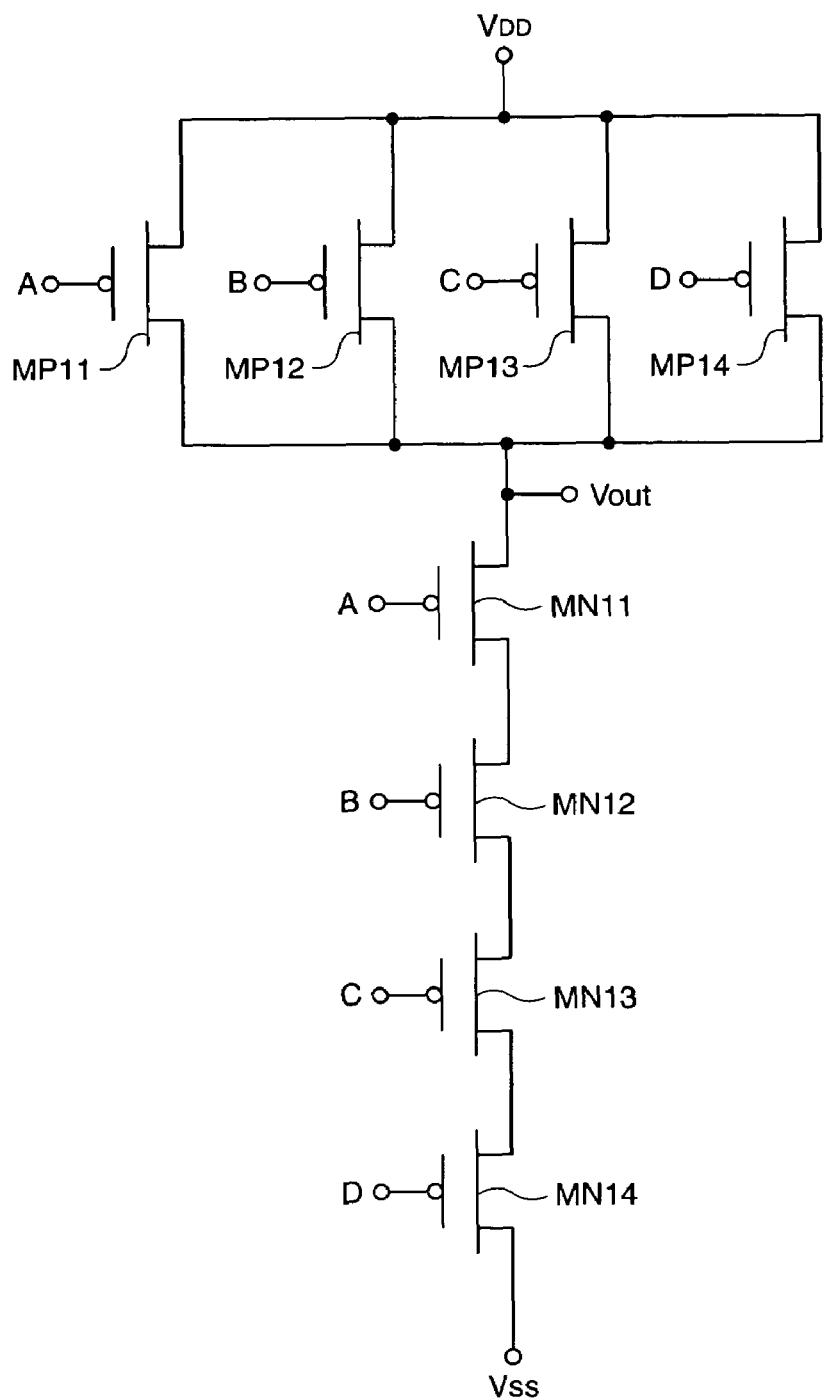
FIG. 15 shows a diagram showing a circuit structure of the semiconductor device of FIG. 14.

FIG. 14 is a cross-sectional view schematically showing a structure of a semiconductor device in accordance with a third embodiment of the present invention, and FIG. 15 is a diagram showing a circuit structure of the semiconductor device of FIG. 14.

Referring to FIG. 14, a dielectric layer 62a is formed on a supporting substrate 61. Then, a semiconductor layer 63a, a dielectric layer 62b and a semiconductor layer 63b are successively laminated on the dielectric layer 62a. It is noted that the semiconductor layer 63b may be formed to have a width smaller than that of the semiconductor layer 63a, such that surfaces of the semiconductor layer 63a near both end sections thereof are exposed through the semiconductor layer 63b.

Further, gate dielectric films 66a are formed on side surfaces of the semiconductor layer 63a. Also, gate dielectric films 66b are formed on side surfaces of the semiconductor layer 63b, and a gate dielectric film 66c is formed on the surface of the semiconductor layer 63b. Further, on the surfaces of the gate dielectric films 66a-66c, gate electrodes 67a-67d are formed in a manner to extend across the surface of the semiconductor layer 63b to the side walls of the semiconductor layers 63a and 63b, and to be disposed orthogonal to laminated layer surfaces of the semiconductor layers 63a and 63b.

Also, n-type impurity introduced layers 64a-64e disposed on both sides of the gate electrodes 67a-67d and among the gate electrodes 67a-67d are formed in the semiconductor layer 63a, thereby forming N-channel field effect transistors MN11-MN14 shown in FIG. 15. Also, p-type impurity introduced layers 65a-65e disposed on both sides of the gate electrodes 67a-67d and among the gate electrodes 67a-67d are formed in the semiconductor layer 63b, thereby forming P-channel field effect transistors MP11-MP14 shown in FIG. 15.

Further, a dielectric layer 70 is deposited on the semiconductor layer 63b where the p-type impurity introduced layers 65a-65e are formed. Contact layers 68a and 68b to make contact with the n-type impurity introduced layers 64a and 64e respectively are formed on the dielectric layer 70, and contact layers 69a-69e to make contact with the p-type impurity introduced layers 65a-65e respectively are formed on the dielectric layer 70. Here, by connecting the gate electrodes 67a-67d with input terminals A-D, respectively, connecting the n-type impurity introduced layer 64e to an output terminal Vout through the contact layer 68b, connecting the p-type impurity introduced layers 65b and 65d with the output terminal Vout through the contact layers 69b and 69d, respectively, connecting the p-type impurity introduced layers 65a, 65c and 65e with a potential input terminal VDD through the contact layers 69a, 69c and 69e, respectively, and connecting the n-type impurity introduced layer 64a with a potential input terminal Vss through the contact layer 68a, a 4-input NAND circuit composed of the P-channel field effect transistors MP11-MP14 and the N-channel field effect transistors MN11-MN14 can be formed, as shown in FIG. 15.

Accordingly, while the P-channel field effect transistors MP11-MP14 and the N-channel field effect transistors MN11-MN14 can be laminated, the 4-input NAND circuit can be formed, and the gate electrodes 67a-67d that are commonly used by the semiconductor layers 63a and 63b can be disposed upright. For this reason, the area occupied by the gate electrodes 67a-67d in the chip area can be reduced, the wiring length of the gate electrodes 67a-67d can be shortened, the propagation delay can be suppressed, and the chip size can be reduced.

It is noted that, in the embodiment shown in FIG. 14, the description is made as to the method for forming the 4-input NAND circuit in which the P-channel field effect transistors MP11-MP14 and the N-channel field effect transistors MN11-MN14 are laminated, and this may be applied to a method for forming an N-input (N is an integer of 2 or greater) NAND circuit.

Figure 16:
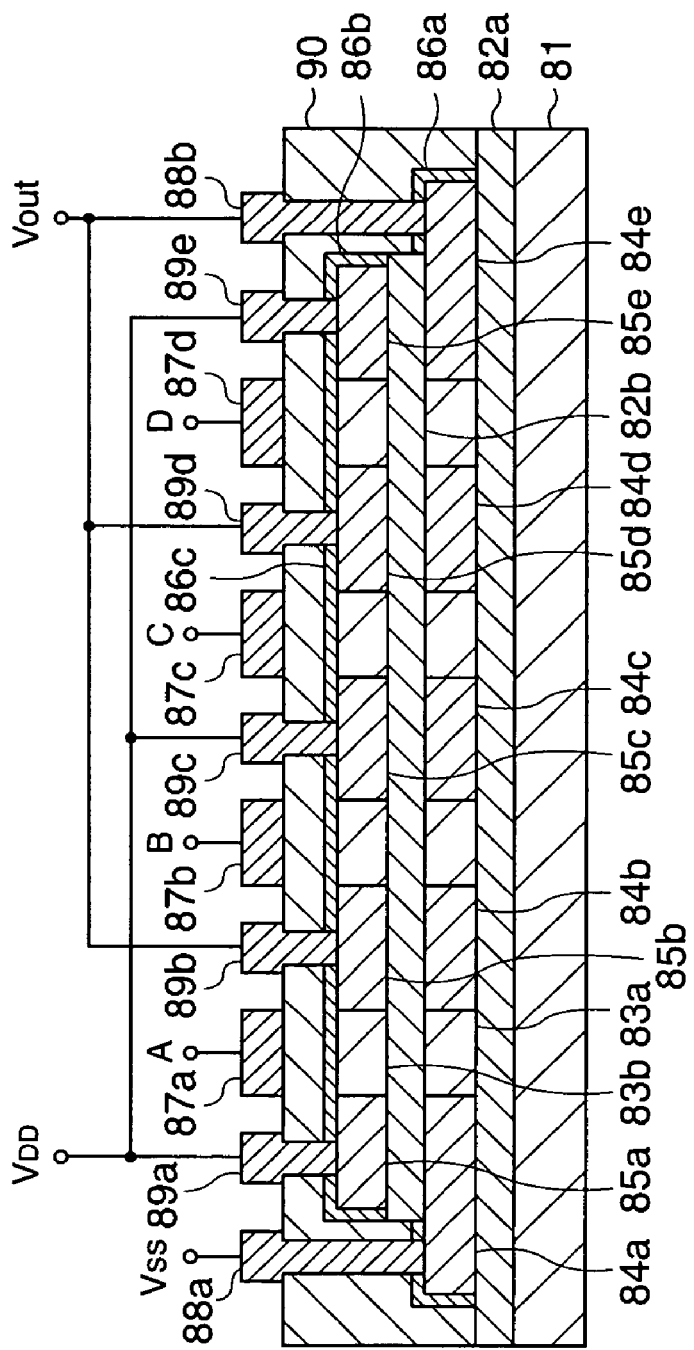
FIG. 16 shows a cross-sectional view schematically showing a structure of a semiconductor device in accordance with a fourth embodiment of the present invention.
Figure 17:
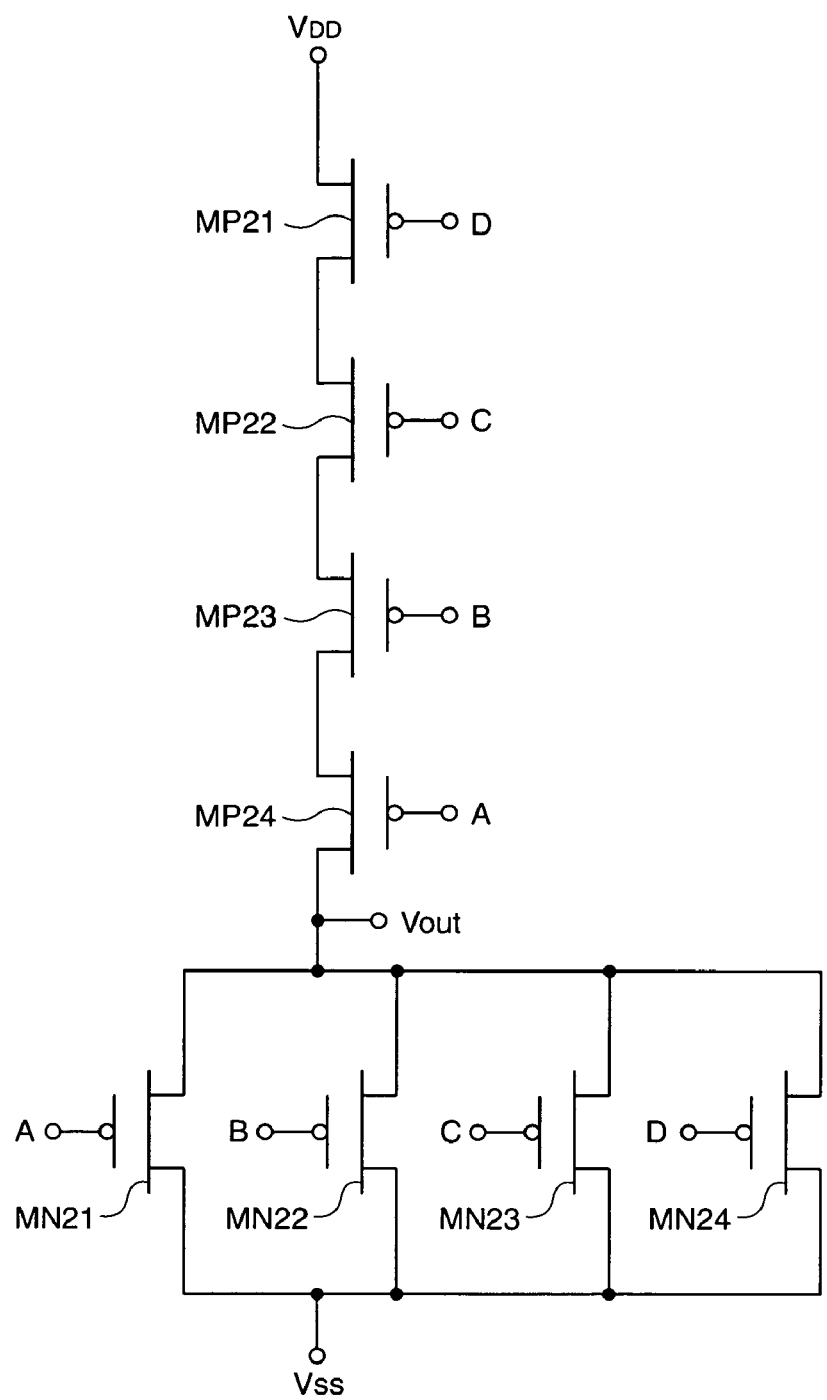
FIG. 17 shows a diagram showing a circuit structure of the semiconductor device of FIG. 16.

FIG. 16 is a cross-sectional view schematically showing a structure of a semiconductor device in accordance with a fourth embodiment of the present invention, and FIG. 17 is a diagram showing a circuit structure of the semiconductor device of FIG. 16.

Referring to FIG. 16, a dielectric layer 82a is formed on a supporting substrate 81. Then, a semiconductor layer 83a, a dielectric layer 82b and a semiconductor layer 83b are successively laminated on the dielectric layer 82a. It is noted that the semiconductor layer 83b may be formed to have a width smaller than that of the semiconductor layer 83a, such that surfaces near both end sections of the semiconductor layer 83a are exposed through the semiconductor layer 83b.

Further, gate dielectric films 86a are formed on side surfaces of the semiconductor layer 83a. Also, gate dielectric films 86b are formed on side surfaces of the semiconductor layer 83b, and a gate dielectric film 86c is formed on the surface of the semiconductor layer 83b. Further, on the surfaces of the gate dielectric films 86a-86c, gate electrodes 87a-87d are formed in a manner to extend across the surface of the semiconductor layer 83b to the side walls of the semiconductor layers 83a and 83b, and to be disposed orthogonal to laminated layer surfaces of the semiconductor layers 83a and 83b.

Also, p-type impurity introduced layers 84a-84e disposed on both sides of the gate electrodes 87a-87d and among the gate electrodes 87a-87d are formed in the semiconductor layer 83a, thereby forming P-channel field effect transistors MP21-MP24 shown in FIG. 17. Also, n-type impurity introduced layers 85a-85e disposed on both sides of the gate electrodes 87a-87d and among the gate electrodes 87a-87d are formed in the semiconductor layer 83b, thereby forming N-channel field effect transistors MN21-MN24 shown in FIG. 17.

Further, a dielectric layer 90 is deposited on the semiconductor layer 83b where the n-type impurity introduced layers 85a-85e are formed. Contact layers 88a and 88b to make contact with the p-type impurity introduced layers 84a and 84e respectively are formed on the dielectric layer 90, and contact layers 89a-89e to make contact with the n-type impurity introduced layers 85a-85e respectively are formed on the dielectric layer 90. Here, by connecting the gate electrodes 87a-87d with input terminals A-D, respectively, connecting the p-type impurity introduced layer 84e to an output terminal Vout through the contact layer 88b, connecting the n-type impurity introduced layers 85b and 85d with the output terminal Vout through the contact layers 89b and 89d, respectively, connecting the n-type impurity introduced layers 85a, 85c and 85e with a potential input terminal Vss through the contact layers 89a, 89c and 89e, respectively, and connecting the p-type impurity introduced layer 84a with a potential input terminal VDD through the contact layer 88a, a 4-input NOR circuit composed of the P-channel field effect transistors MP21-MP24 and the N-channel field effect transistors MN21-MN24 can be formed, as shown in FIG. 17.

Accordingly, while the P-channel field effect transistors MP21-MP24 and the N-channel field effect transistors MN21-MN24 can be laminated, the 4-input NOR circuit can be formed, and the gate electrodes 87a-87d that are commonly used by the semiconductor layers 83a and 83b can be disposed upright. For this reason, the area occupied by the gate electrodes 87a-87d in the chip area can be reduced, the wiring length of the gate electrodes 87a-87d can be shortened, the propagation delay can be suppressed, and the chip size can be reduced.

It is noted that, in the embodiment shown in FIG. 16, the description is made as to the method for forming the 4-input NOR circuit in which the P-channel field effect transistors MP21-MP24 and the N-channel field effect transistors MN21-MN24 are laminated, and this may be applied to a method for forming an N-input (N is an integer of 2 or greater) NOR circuit.

Figure 18:
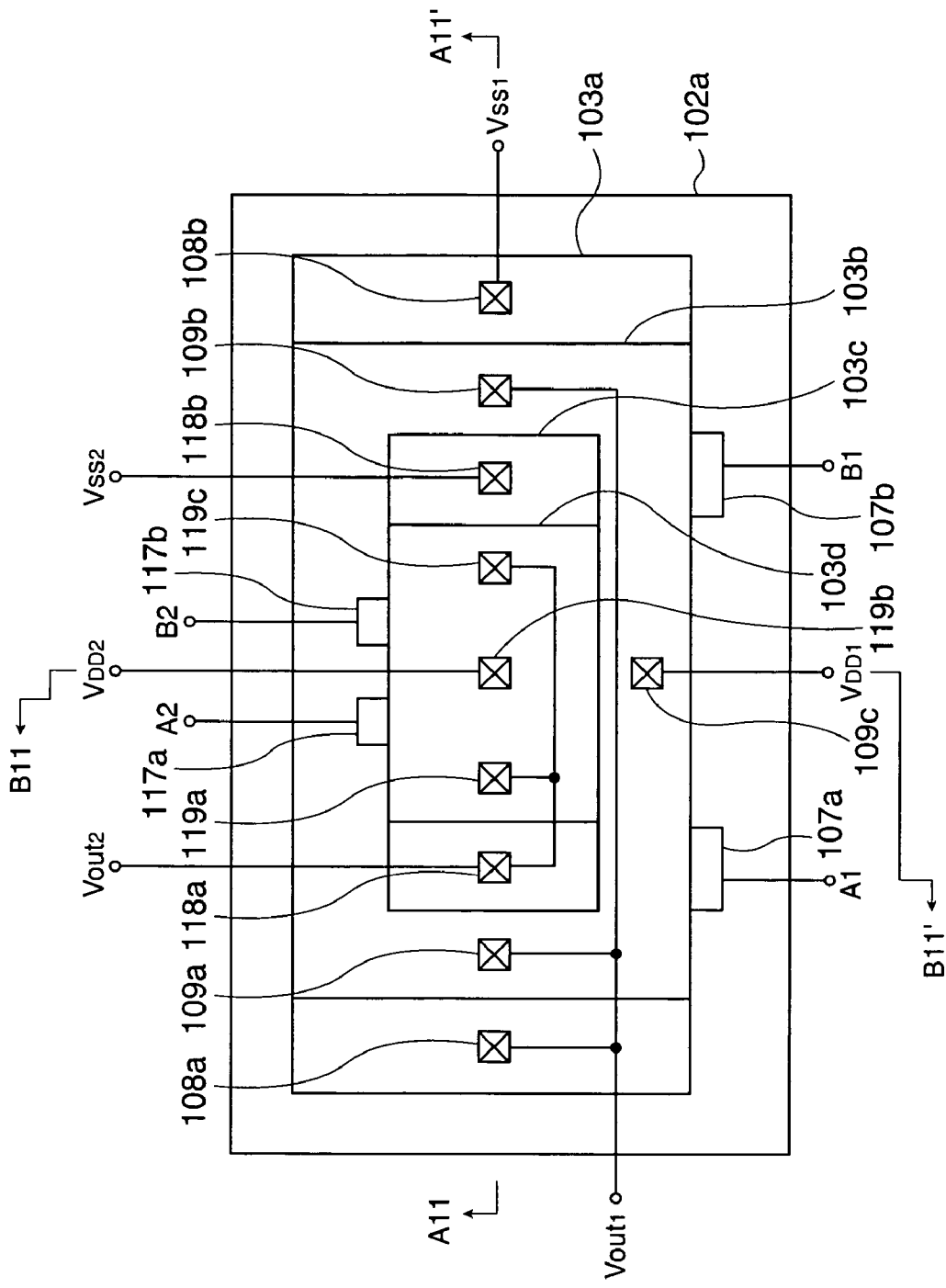
FIG. 18 shows a plan view schematically showing a structure of a semiconductor device in accordance with a fifth embodiment of the present invention.
Figure 20:
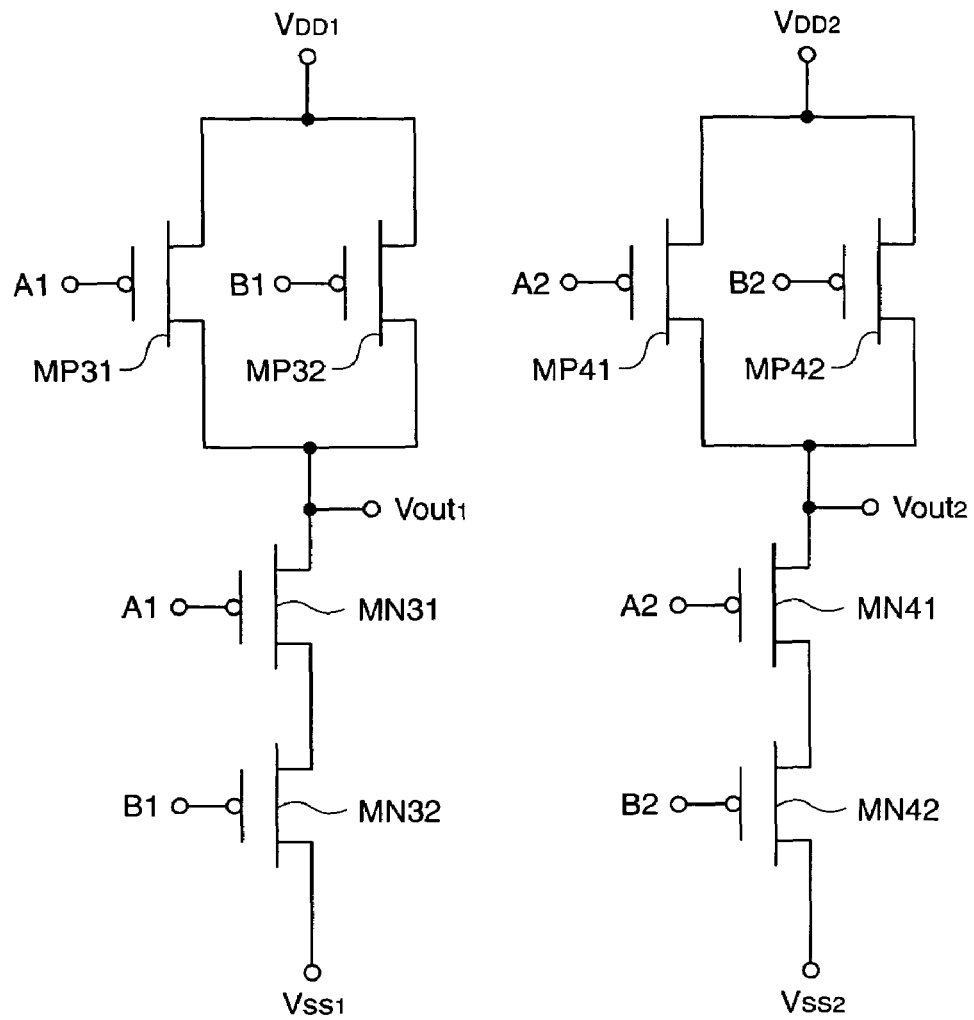
FIG. 20 shows a diagram showing a circuit structure of the semiconductor device of FIG. 18.

FIG. 18 is a plan view schematically showing a structure of a semiconductor device in accordance with a fifth embodiment of the present invention, FIG. 19 (a) is a cross-sectional view taken along lines A11-A1140 of FIG. 18, FIG. 19 (b) is a cross-sectional view taken along lines B11-B11' of FIG. 18, and FIG. 20 is a diagram showing a circuit structure of the semiconductor device of FIG. 18.

Referring to FIG. 18 and FIG. 19, a dielectric layer 102a is formed on a supporting substrate 101. Then, a semiconductor layer 103a, a dielectric layer 102b, a semiconductor layer 103b, a dielectric layer 102c, a semiconductor layer 103c, a dielectric layer 102d and a semiconductor layer 103d are successively laminated on the dielectric layer 102a. It is noted that the semiconductor layers 103a-103d may be formed to have widths that become gradually narrower as they are disposed in upper layers, such that surfaces of the semiconductor layers 103a-103d near both end sections thereof are exposed through the semiconductor layers 103a-103d.

Further, gate dielectric films 106a are formed on side surfaces of the semiconductor layer 103a, and gate dielectric films 106b are formed on side surfaces of the semiconductor layer 103b. Further, on the surfaces of the gate dielectric films 106a and 106b, gate electrodes 107a and 107b are formed commonly on side walls of the semiconductor layers 103a and 103b in a manner to be disposed orthogonal to laminated layer surfaces of the semiconductor layers 103a and 103b.

Further, gate dielectric films 106c are formed on side surfaces of the semiconductor layer 103c, and gate dielectric films 106d are formed on side surfaces of the semiconductor layer 103d. Further, on the surfaces of the gate dielectric films 106c and 106d, gate electrodes 117a and 117b are formed commonly on side walls of the semiconductor layers 103c and 103d in a manner to be disposed orthogonal to laminated layer surfaces of the semiconductor layers 103c and 103d.

Also, n-type impurity introduced layers 104a-104c disposed on both sides of the gate electrodes 107a and 107b and between the gate electrodes 107a and 107b are formed in the semiconductor layer 103a, thereby forming N-channel field effect transistors MN31 and MN32 shown in FIG. 20. Also, p-type impurity introduced layers 105a-105c disposed on both sides of the gate electrodes 107a and 107b and between the gate electrodes 107a and 107b are formed in the semiconductor layer 103b, thereby forming P-channel field effect transistors MP31 and MP32 shown in FIG. 20.

Also, n-type impurity introduced layers 114a-114c disposed on both sides of the gate electrodes 117a and 117b and between the gate electrodes 117a and 117b are formed in the semiconductor layer 103c, thereby forming N-channel field effect transistors MN41 and MN42 shown in FIG. 20. Also, p-type impurity introduced layers 115a-115c disposed on both sides of the gate electrodes 117a and 117b and between the gate electrodes 117a and 117b are formed in the semiconductor layer 103d, thereby forming P-channel field effect transistors MP41 and MP42 shown in FIG. 20.

Further, a dielectric layer 110 is deposited on the semiconductor layer 103d where the p-type impurity introduced layers 115a-111c are formed. Contact layers 108a and 108b to make contact with the n-type impurity introduced layers 104a and 104c respectively are formed on the dielectric layer 110, and contact layers 109a and 109b to make contact with the p-type impurity introduced layers 105a and 105c respectively are formed on the dielectric layer 110. Also, contact layers 118a and 118b to make contact with the n-type impurity introduced layers 114a and 114c respectively are formed on the dielectric layer 110, and contact layers 119a and 119b to make contact with the p-type impurity introduced layers 115a and 115c respectively are formed on the dielectric layer 110. Further, a contact layer 109c to make contact with the p-type impurity introduced layer 105b is formed on the dielectric layer 110, and a contact layer 119b to make contact with the p-type impurity introduced layer 115b is formed on the dielectric layer 110.

Here, by connecting the gate electrodes 107a and 107b with input terminals A1 and B1, respectively, connecting the n-type impurity introduced layer 104a with an output terminal Vout1 through the contact layer 108a, connecting the p-type impurity introduced layers 105a and 105c with the output terminal Vout1 through the contact layers 109a and 109b, respectively, connecting the p-type impurity introduced layer 105b with a potential input terminal VDD1 through the contact layer 109c, and connecting the n-type impurity introduced layer 104c with a potential input terminal Vss1 through the contact layer 108b, a 2-input NAND circuit composed of the P-channel field effect transistors MP31 and MP32 and the N-channel field effect transistors MN31 and MN32 can be formed, as shown in FIG. 20.

Also, by connecting the gate electrodes 117a and 117b with input terminals A2 and B2, respectively, connecting the n-type impurity introduced layer 114a with an output terminal Vout2 through the contact layer 118a, connecting the p-type impurity introduced layers 115a and 115c with the output terminal Vout2 through the contact layers 119a and 119c, respectively, connecting the p-type impurity introduced layer 115b with a potential input terminal VDD2 through the contact layer 119b, and connecting the n-type impurity introduced layer 114c with a potential input terminal Vss2 through the contact layer 118b, a 2-input NAND circuit composed of the P-channel field effect transistors MP41 and MP42 and the N-channel field effect transistors MN41 and MN42 can be formed, as shown in FIG. 20.

Accordingly, a plurality of two-input NAND circuits can be three-dimensionally disposed, an enlargement in the chip size can be suppressed, and devices having various functions can be composed.

Figure 21:
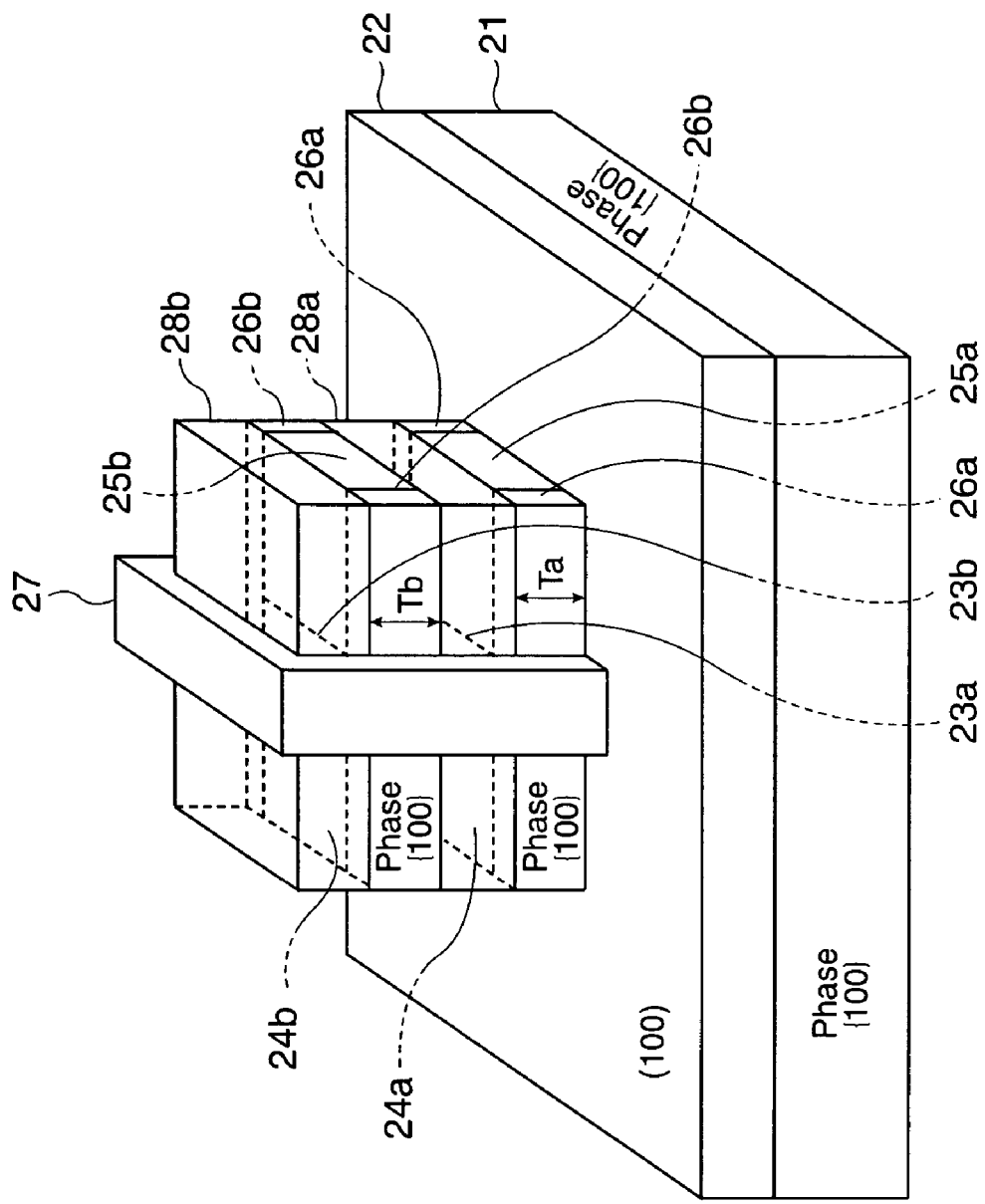
FIG. 21 shows a perspective view schematically showing a structure of a semiconductor device in accordance with a sixth embodiment of the present invention.

FIG. 21 is a perspective view schematically showing a structure of a semiconductor device in accordance with a sixth embodiment of the present invention.

Referring to FIG. 21, a dielectric layer 22 is formed on a (100) single crystal semiconductor substrate 21. A single crystal semiconductor layer 23a, a dielectric layer 28a, a single crystal semiconductor layer 23b and a dielectric layer 28b are successively laminated on the dielectric layer 22, and the single crystal semiconductor layers 23a and 23b are element-isolated such that their side surfaces in a {100} plane orientation are exposed. Gate dielectric films 26a are formed on side surfaces on both sides of the single crystal semiconductor layer 23a, and gate dielectric films 26b are formed on side surfaces on both sides of the single crystal semiconductor layer 23b. Further, on the surfaces of the gate dielectric films 26a and 26b, a gate electrode 27 is formed in a manner to extend across the surface of the single crystal semiconductor layer 23b to side walls on both sides of the single crystal semiconductor layers 23a and 23b, and to be disposed orthogonal to laminated layer surfaces of the single crystal semiconductor layers 23a and 23b. Also, source/drain layers 24a and 25a disposed on both sides of the gate electrode 27 respectively are formed in the single crystal semiconductor layer 23a. Further, source/drain layers 24b and 25b disposed on both sides of the gate electrode 27 respectively are formed in the single crystal semiconductor layer 23b.

Accordingly, channel regions can be formed on the side of the side surfaces of the single crystal semiconductor layers 23a and 23b, and field effect transistors can be formed without disposing the gate electrode 27 on the side of the surface of the single crystal semiconductor layers 23a and 23b. For this reason, even when field effect transistors are formed in the single crystal semiconductor layers 23a and 23b, respectively, the flatness of the surface side of the single crystal semiconductor layers 23a and 23b can be secured, and even when the single crystal semiconductor layers 23a and 23b are laminated, deterioration of the crystallinity of the single crystal semiconductor layers 23a and 23b can be suppressed. Consequently, while an enlargement in the chip size can be suppressed, integration of the field effect transistors can be achieved, and while the parasitic capacitance of the field effect transistors can be reduced, steep sub-threshold characteristics can be obtained, and high speed operations at low voltages can be achieved.

Also, by disposing the gate electrode 27 orthogonal to the laminated layer surfaces of the single crystal semiconductor layers 23a and 23b, the area occupied by the gate electrode 27 in the chip surface can be reduced, and the wiring length of the gate electrode 27 can be shortened. For this reason, while suppressing the propagation delay, integration of field effect transistors in higher density can be achieved, the chip size can be reduced, and higher operation speed, smaller size and lower cost of field effect transistors can be achieved.

Also, by disposing the gate electrode 27 to extend across the surface of the single crystal semiconductor layer 23b in the uppermost layer, even when ions are injected from the surface side of the single crystal semiconductor layer 23b, the source/drain layers 24a and 25a and the source/drain layers 24b and 25b can be formed in the single crystal semiconductor layers 23a and 23b, respectively, by using the gate electrode 27 as a mask. For this reason, the source/drain layers 24a and 25a and the source/drain layers 24b and 25b can be formed in a self-aligned manner with respect to the gate electrode 27 disposed on the side walls of the single crystal semiconductor layer layers 23a and 23b, respectively, such that the complexity in the manufacturing process can be controlled, and field effect transistors with excellent characteristics can be manufactured with an excellent reproducibility.

Also, for example, when a P-channel field effect transistor is formed in the single crystal semiconductor layer 23a, and an N-channel field effect transistor is formed in the single crystal semiconductor layer 23b, the film thickness Ta of the single crystal semiconductor layer 23a may be made greater than the film thickness Tb of the single crystal semiconductor layer 23b. It is noted here that the ratio of the film thickness of the single crystal semiconductor layer 23a and that of the single crystal semiconductor layer 23b may preferably be an inverse ratio of a mobility ratio between holes and electrons. For example, the film thickness Ta of the single crystal semiconductor layer 23a may be in a range of two to three times the film thickness Tb of the single crystal semiconductor layer 23b.

Accordingly, the gate width of the P-channel field effect transistor can be made greater than the gate width of the N-channel field effect transistor without expanding the layout area of the P-channel field effect transistor compared to the N-channel field effect transistor. For this reason, even when the P-channel field effect transistor and the N-channel field effect transistor have different mobility, the current drivability of the P-channel field effect transistor can be matched to that of the N-channel field effect transistor while maintaining the balance in the layout placement between the N-channel field effect transistor and the P-channel field effect transistor. As a result, the layout design of CMOS circuits can be effectively performed, restrictions on the signal propagation speed can be alleviated, integration of semiconductor devices in higher density can be achieved, and higher speed of semiconductor devices can be achieved.

Figure 22:
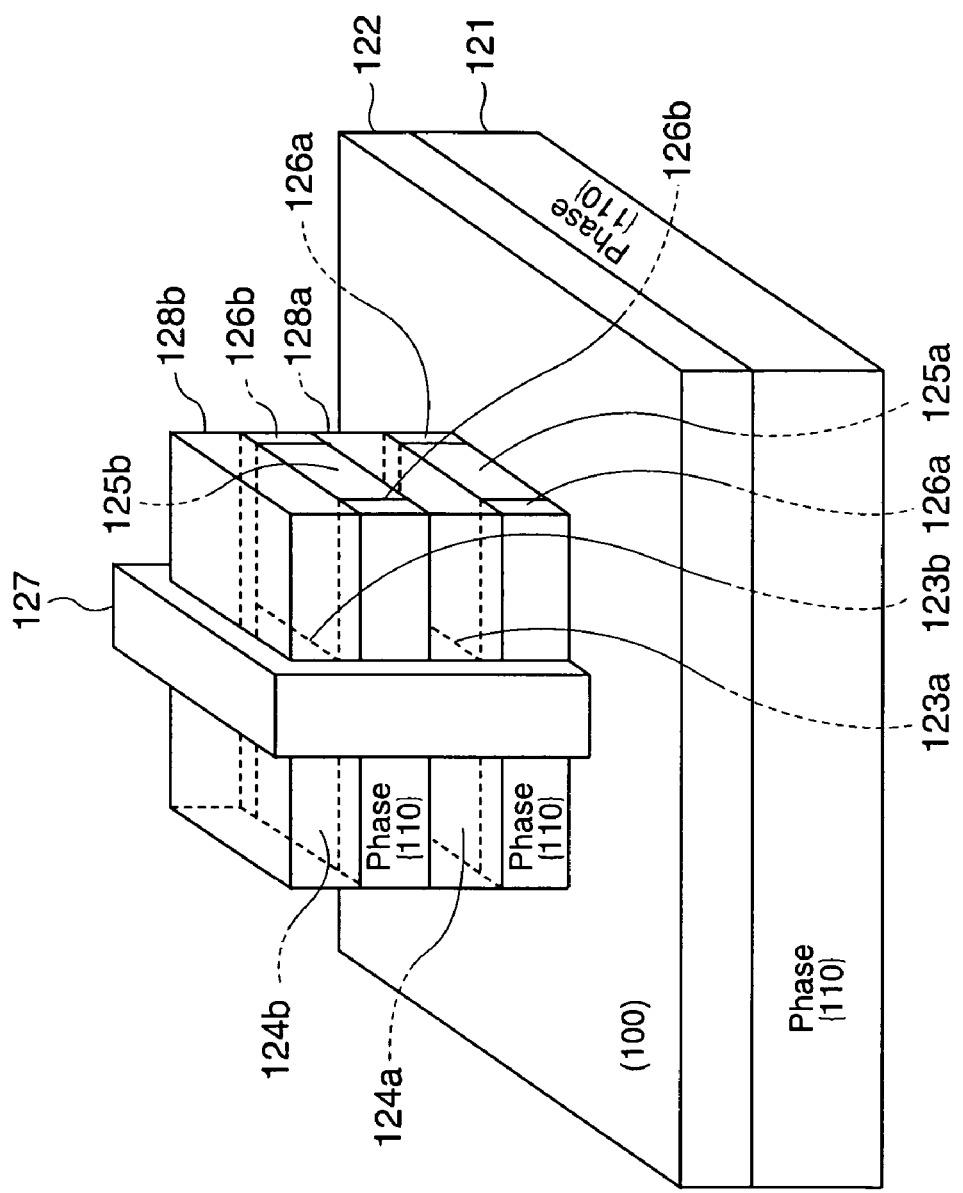
FIG. 22 shows a perspective view schematically showing a structure of a semiconductor device in accordance with a seventh embodiment of the present invention.

FIG. 22 is a perspective view schematically showing a structure of a semiconductor device in accordance with a seventh embodiment of the present invention.

Referring to FIG. 22, a dielectric layer 122 is formed on a (100) single crystal semiconductor substrate 121. A single crystal semiconductor layer 123a, a dielectric layer 128a, a single crystal semiconductor layer 123b and a dielectric layer 128b are successively laminated on the dielectric layer 122, and the single crystal semiconductor layers 123a and 123b are element-isolated such that their side surfaces in a {110} plane orientation are exposed. Gate dielectric films 126a are formed on side surfaces on both sides of the single crystal semiconductor layer 123a, and gate dielectric films 126b are formed on side surfaces on both sides of the single crystal semiconductor layer 123b. Further, on the surfaces of the gate dielectric films 126a and 126b, a gate electrode 127 is formed in a manner to extend across the surface of the single crystal semiconductor layer 123b to side walls on both sides of the single crystal semiconductor layers 123a and 123b, and to be disposed orthogonal to laminated layer surfaces of the single crystal semiconductor layers 123a and 123b. Also, source/drain layers 124a and 125a disposed on both sides of the gate electrode 127 respectively are formed in the single crystal semiconductor layer 123a. Further, source/drain layers 124b and 125b disposed on both sides of the gate electrode 127 respectively are formed in the single crystal semiconductor layer 123b.

Here, by making the single crystal semiconductor layer 123a to be p-type, and the source/drain layers 124a and 125a to be n-type, an N-channel field effect transistor can be formed in the single crystal semiconductor layer 123a. Also, by making the single crystal semiconductor layer 123b to be n-type, and the source/drain layers 124b and 125b to be p-type, a P-channel field effect transistor can be formed in the single crystal semiconductor layer 123b.

Accordingly, the mobility of the P-channel field effect transistor and that of the N-channel field effect transistor can be generally matched, without differentiating the layout area of the N-channel field effect transistor from that of the P-channel field effect transistor. For this reason, the current drivability of the N-channel field effect transistor and that of the P-channel field effect transistor can be balanced, while balancing the parasitic capacitances of the P-channel field effect transistor and the N-channel field effect transistor, the S/N ratio of CMOS circuits can be improved, and higher speed and higher density integration of semiconductor devices can be achieved.

What is claimed is:

1. A method for manufacturing a semiconductor device, comprising:

forming an opening section comprising opposing surfaces forming a groove to expose side surfaces of first and second semiconductor layers;

thermally oxidizing the first and second semiconductor layer through the opening section, to thereby form a gate dielectric film on side walls of the first and second semiconductor layers;

forming a gate electrode that is embedded in the opening section through the gate dielectric film and extends across a surface of an uppermost layer of the semiconductor layers;

conducting an ion injection of P-type impurity from the surface side of the semiconductor layers using the gate electrode as a mask, to thereby form first source/drain layers disposed respectively on both sides of the gate electrode in the first semiconductor layer; and conducting an ion injection of N-type impurity from the surface side of the semiconductor layer using the gate electrode as a mask, to thereby form second source/drain layers disposed respectively on both sides of the gate electrode in the second semiconductor layer.

2. A method for manufacturing a semiconductor device according to claim 1, wherein B ions are used for the ion injection of the P-type impurity, and Sb, As or P ions are used for the ion injection of the N-type impurity.

3. A method for manufacturing a semiconductor device according to claim 1, comprising:

forming a first groove so as to mutually isolate a lower layer of the semiconductor layers;

forming a second groove that mutually isolate an upper layer of the semiconductor layers so as to expose a part of the lower layer of the semiconductor layers; and embedding the first groove and the second groove with a dielectric.

4. A method for manufacturing a semiconductor device according to claim 1, comprising:

exposing at least one of the surfaces and the side wall of the first source/drain layers formed in the first semiconductor layer;

forming a first contact layer that contacts at least one of the surfaces and the side wall of the first source/drain layers;

exposing at least one of the surface and the side wall of the second source/drain layers formed in the second semiconductor layer; and forming a second contact layer that contacts at least one of the surfaces and the side wall of the second source/drain layers.

5. A method for manufacturing a semiconductor device, comprising:

depositing a dielectric film on first and second semiconductor layers;

forming an opening section in the dielectric film, said opening section comprising opposing surfaces forming a groove, thereby exposing side surfaces of the first and second semiconductor layers, a portion of the side surfaces becomes a channel region in an uppermost layer of said side surfaces;

thermally oxidizing the first and second semiconductor layer through the opening section, to thereby form a gate dielectric film on the side walls of the first and second semiconductor layers in the opening section and on the surface of the semiconductor layer in the uppermost layer;

conducting an ion injection of P-type impurity from the surface side of the semiconductor layer through the dielectric film with the opening section formed therein, to thereby form first source/drain layers disposed respectively on both sides of the channel region in the first semiconductor layer;

conducting an ion injection of N-type impurity from the surface side of the semiconductor layer through the dielectric film with the opening section formed therein, to thereby form second source/drain layers disposed respectively on both sides of the channel region in the second semiconductor layer; and forming a gate electrode that is embedded in the opening section through the gate dielectric film.

6. A method for manufacturing a semiconductor device, comprising:

forming a first opening section comprising opposing surfaces forming a groove, said first opening section thereby exposing that exposes side surfaces of first and second semiconductor layers;

forming a second opening section that exposes a surface of the semiconductor layer in a lower layer;

thermally oxidizing the first and second semiconductor layers through the first and second opening sections, to thereby form a gate dielectric film on side walls of the first and second semiconductor layers in the first opening section and on a surface of the semiconductor layer in the second opening section;

removing the gate dielectric film formed on the surface of the semiconductor layer in the second opening section;

forming a gate electrode embedded in the first opening section through the gate dielectric film, and a first contact layer that is embedded in the second opening section and contacts the semiconductor layer in the lower layer;

conducting an ion injection of P-type impurity from the surface side of the semiconductor layer, to thereby form first source/drain layers disposed respectively on both sides of the gate electrode in the first semiconductor layer;

conducting an ion injection of N-type impurity from the surface side of the semiconductor layer, to thereby form second source/drain layers disposed respectively on both sides of the gate electrode in the second semiconductor layer; and forming a second contact layer that contacts the semiconductor layer.

* * * * *